United States Patent
Ishikura

(10) Patent No.: US 9,299,823 B2
(45) Date of Patent: Mar. 29, 2016

(54) SEMICONDUCTOR DEVICE AND METHOD OF MAKING INCLUDING CAP LAYER AND NITRIDE SEMICONDUCTOR LAYER

(71) Applicant: Renesas Electronics Corporation, Kawasaki-shi, Kanagawa (JP)

(72) Inventor: Kohji Ishikura, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 83 days.

(21) Appl. No.: 14/031,852

(22) Filed: Sep. 19, 2013

(65) Prior Publication Data
US 2014/0091322 A1   Apr. 3, 2014

(30) Foreign Application Priority Data

Sep. 28, 2012 (JP) ................................. 2012-215346

(51) Int. Cl.
*H01L 31/062* (2012.01)
*H01L 31/113* (2006.01)
*H01L 29/778* (2006.01)
*H01L 29/66* (2006.01)
(Continued)

(52) U.S. Cl.
CPC ............ *H01L 29/778* (2013.01); *H01L 29/452* (2013.01); *H01L 29/475* (2013.01); *H01L 29/66431* (2013.01); *H01L 29/66462* (2013.01); *H01L 29/7787* (2013.01); *H01L 29/2003* (2013.01)

(58) Field of Classification Search
CPC ...................... H01L 29/66462; H01L 29/7787; H01L 29/1066; H01L 29/7786; H01L 29/66431; H01L 29/778; H01L 29/7783; H01L 29/802; H01L 29/0891
USPC ............. 257/194, 192, 76, 190, 195, 189, 20, 257/24, 264
See application file for complete search history.

(56) References Cited

U.S. PATENT DOCUMENTS 7,038,252 B2   5/2006   Saito et al.
7,816,707 B2  10/2010   Hikita et al.
(Continued)

FOREIGN PATENT DOCUMENTS

JP   11-261053 A   9/1999
JP   2005-244072 A   9/2005
(Continued)

OTHER PUBLICATIONS

Ray-Min Lin et al., Enhanced Characteristics of Blue InGaN/GaN Light-Emitting Diodes by Using Selective Activation to Modulate the Lateral Current Spreading Length, Applied Physics Letters 92, 261105, 2008, 3 pages.

*Primary Examiner* — Shouxiang Hu
(74) *Attorney, Agent, or Firm* — Foley & Lardner LLP

(57) ABSTRACT

To enhance the reliability of the semiconductor device using a nitride semiconductor. A channel layer is formed over a substrate, a barrier layer is formed over the channel layer, a cap layer is formed over the barrier layer, and a gate electrode is formed over the cap layer. In addition, a nitride semiconductor layer is formed in a region where the cap layer over the barrier layer is not formed, and a source electrode and a drain electrode are formed over the nitride semiconductor layer. The cap layer is a p-type semiconductor layer, and the nitride semiconductor layer includes the same type of material as the cap layer and is in an intrinsic state or an n-type state.

2 Claims, 23 Drawing Sheets

(51) Int. Cl.
*H01L 29/45* (2006.01)
*H01L 29/47* (2006.01)
*H01L 29/20* (2006.01)

(56) References Cited

U.S. PATENT DOCUMENTS

| | | | |
|---|---|---|---|
| 8,592,866 | B2 | 11/2013 | Yanagihara et al. |
| 8,604,486 | B2 * | 12/2013 | He .................................. 257/76 |
| 2009/0146185 | A1 * | 6/2009 | Suh et al. ....................... 257/194 |
| 2009/0212325 | A1 * | 8/2009 | Sato ................................ 257/192 |
| 2009/0212326 | A1 * | 8/2009 | Sato ................................ 257/192 |
| 2013/0032860 | A1 * | 2/2013 | Marino et al. ................. 257/194 |
| 2013/0082276 | A1 * | 4/2013 | Park et al. ........................ 257/76 |

FOREIGN PATENT DOCUMENTS

| | | |
|---|---|---|
| JP | 2006-339561 A | 12/2006 |
| JP | 2007-201279 A | 8/2007 |
| JP | 2008-244324 A | 10/2008 |
| JP | 2009-206123 A | 9/2009 |

* cited by examiner

SEMICONDUCTOR DEVICE AND METHOD OF MAKING INCLUDING CAP LAYER AND NITRIDE SEMICONDUCTOR LAYER

CROSS-REFERENCE TO RELATED APPLICATION

The disclosure of Japanese Patent Application No. 2012-215346 filed on Sep. 28, 2012 including the specification, drawings and abstract is incorporated herein by reference in its entirety.

BACKGROUND

The present invention relates a semiconductor device and a method of manufacturing the same, and can be preferably used for a semiconductor device using a nitride semiconductor, for example, and a method of manufacturing the same.

GaN-based nitride semiconductors, having a wider band gap and a higher electronic speed than Si and GaAs, are expected to be applied to transistors in high withstand voltage, high output, and high frequency applications, and are actively developed recently.

Japanese Patent Laid-Open No. 11-261053 describes a technique related to a High Electron Mobility Transistor (HEMT) including a GaN-based compound semiconductor.

Japanese Patent Laid-Open No. 2005-244072 describes a technique related to a field effect transistor using a normally-off nitride semiconductor.

Japanese Patent Laid-Open No. 2006-339561 describes a technique related to a field effect transistor including a normally-off nitride semiconductor.

Japanese Patent Laid-Open No. 2008-244324 describes a technique related to an etching method of a nitride compound semiconductor layer and a semiconductor device manufactured using the method.

Non-Patent Document 1 (Ray-Ming Lin, Appl. Phys. Lett. 92, 261,105 (2008) "Enhanced characteristics of blue InGaN/GaN light-emitting diodes by using selective activation to modulate the lateral current spreading length") describes a technique related to an InGaN/GaN-based blue light emitting diode.

SUMMARY

There are semiconductor devices using nitride semiconductors, which are also desired to have enhanced reliability as much as possible. Alternatively, the enhancement of the performance of the semiconductor devices is desired, or realization of the both is desired.

The other problems and the new feature will become clear from the description of the present specification and the accompanying drawings.

According to an embodiment, a second nitride semiconductor layer is formed over a first nitride semiconductor layer, and after a first metal Layer including titanium or tantalum has been formed over the second nitride semiconductor layer excluding a first region, the reaction of the first metal layer and the second nitride semiconductor by performing thermal treatment forms a metal nitride layer. Subsequently, after removing the metal nitride layer by wet etching and leaving the second nitride semiconductor layer of the first region, a gate electrode is formed over the second nitride semiconductor layer remaining in the first region.

In addition, according to an embodiment, there are provided a barrier layer formed over a channel layer, cap layer formed over the barrier layer, a gate electrode formed over the cap layer, a nitride semiconductor layer formed over the barrier layer in a region which is different from the cap layer, and a source electrode and a drain electrode formed over the nitride semiconductor layer. In addition, the cap layer is a p-type semiconductor layer, whereas the nitride semiconductor layer includes the same material as the cap layer and is in an intrinsic state or an n-type state.

In addition, according to an embodiment, there are provided a barrier layer formed over a channel layer, a cap layer formed over the barrier layer, a gate electrode formed over the cap layer, a nitride semiconductor layer formed over the barrier layer in a region which is different from the cap layer, and a source electrode and a drain electrode formed over the nitride semiconductor layer. In addition, the cap layer has a stacked structure of a first layer and a second layer over the first layer, the second layer is a p-type semiconductor layer, and the nitride semiconductor layer includes a similar material to the first layer and is in an n-type state.

In addition, according to an embodiment, there are provided a barrier layer formed over a channel layer, a cap layer formed over the barrier layer, a gate electrode formed over the cap layer, and a source electrode and a drain electrode formed in a region over the barrier layer and not having the cap layer formed therein. In addition, the cap layer is in an intrinsic state, and a surface layer part of the barrier layer in a region which is not covered with the cap layer has a higher electron carrier concentration than the barrier layer BR of a region other than the surface layer part.

According to an embodiment, the reliability of the semiconductor device can be enhanced. Alternatively, the performance of the semiconductor device can be enhanced. It is also possible to realize the both.

DETAILED DESCRIPTION

Figure 1:
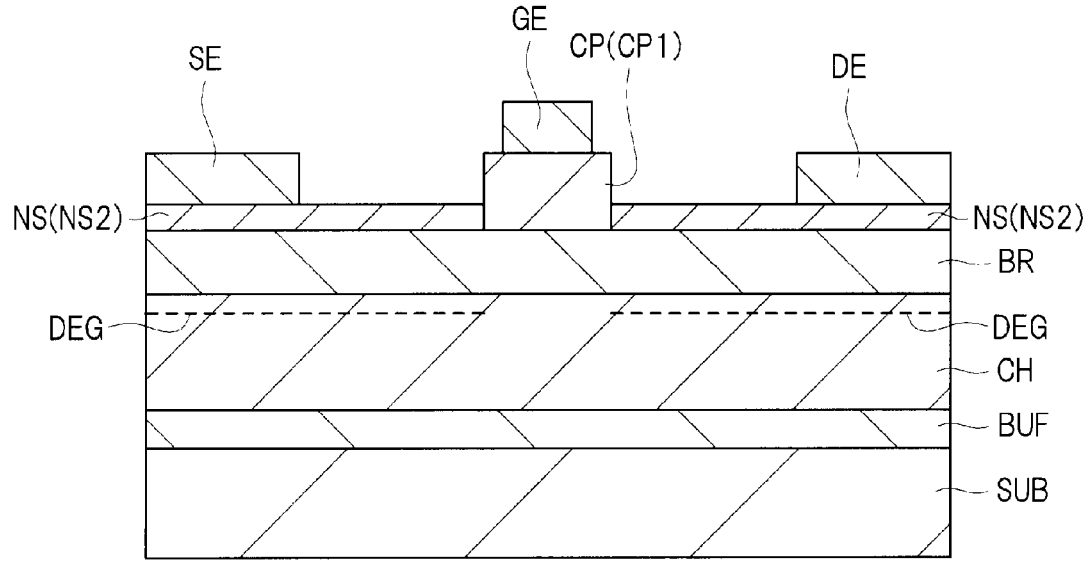
FIG. 1 is a main part cross-sectional view of a semiconductor device of an embodiment.

The following embodiments will be explained, divided into plural sections or embodiments, if necessary for convenience. Except for the case where it shows clearly in particular, they are not mutually unrelated and one has relationships such as a modification, details, and supplementary explanation of some or entire of another. In the following embodiments, when referring to the number of elements, and the like (including the number, a numeric value, an amount, a range, and the like), they may be not restricted to the specific number but may be greater or smaller than the specific number, except for the case where they are clearly specified in particular and where they are clearly restricted to a specific number theoretically. Furthermore, in the following embodiments, it is needless to say that an element (including an element step and the like) is not necessarily indispensable, except for the case where it is clearly specified in particular and where it is considered to be clearly indispensable from a theoretical point of view, or the like. Similarly, in the following embodiments, when shape, position relationship, or the like of an element or the like is referred to, what resembles or is similar to the shape substantially shall be included, except for the case where it is clearly specified in particular and where it is considered to be clearly not right from a theoretical point of view. This statement also applies to the numeric value and range described above.

In the following, embodiments will be described in detail based on drawings. In all the drawings for explaining embodiments, the same symbol is attached to the same member, as a principle, and the repeated explanation thereof is omitted. Additionally, in the following embodiments, explanation of identical or similar parts will not be repeated as a principle unless particularly required.

Additionally, in the drawings used in the embodiments, hatching may be omitted in order to make a drawing intelligible even if it is a cross-sectional view. In addition, hatching may be attached in order to make a drawing intelligible even if it is a plan view.

(First Embodiment)
<Structure of the Semiconductor Device>

A semiconductor device of the present First Embodiment, as well as the Second and Third Embodiments described below, is a semiconductor device having a field effect transistor, which is here a High Electron Mobility Transistor (HEMT).

FIG. 1 is a main part cross-sectional view of a semiconductor device of the present embodiment.

As illustrated in FIG. 1, the semiconductor device of the present embodiment has a buffer layer BUF formed over a substrate SUB, a channel layer CH including a nitride semiconductor formed over the buffer layer BUF, a barrier layer (an electron supply layer, a nitride semiconductor layer) BR including a nitride semiconductor formed over the channel layer CH, and a cap layer CP and a nitride semiconductor layer NS formed over the barrier layer BR. That is, the buffer layer BUF, the channel layer CH, and the barrier layer BR are formed (stacked), in the order from bottom to top, over the main surface (top surface) of the substrate SUB, and the cap layer CP and the nitride semiconductor layer NS are formed over the barrier layer BR in planar regions which are different from each other. A gate electrode GE is formed over the cap layer CP, and a source electrode SE and a drain electrode DE are formed over the nitride semiconductor layer NS.

The substrate SUB is a semiconductor substrate (single crystal silicon substrate) including, for example, silicon (Si). As another form, a sapphire substrate or a silicon carbonate (SiC) substrate can also be used for the substrate SUB.

The buffer layer BUF is formed in order to alleviate the lattice constant difference between the substrate SUB and the channel layer CH. For example, the lattice constant difference between silicon (Si) included in the substrate SUB and gallium nitride (GaN) included in the channel layer CH can be relaxed by the buffer layer BUF. That is, there is a concern that when the channel layer CH including gallium nitride (GaN) is formed directly over the substrate SUB including silicon (Si), a number of cracks may occur in the channel layer CH, whereby a good epitaxial growth layer cannot be obtained, making it difficult to manufacture a high electron mobility transistor. Accordingly, the buffer layer BUF is inserted between the substrate SUB and the channel layer CH for the purpose of lattice relaxation. Formation of the buffer layer BUF allows a good epitaxial growth layer to be provided in the channel layer CH formed over the buffer layer BUF and facilitates manufacturing of a high electron mobility transistor.

The buffer layer BUF can be a gallium nitride (GaN) layer, an aluminum gallium nitride (AlGaN) layer, an aluminum nitride (AlN) layer, or a stacked membrane thereof.

The channel layer CH, including a nitride semiconductor, is preferably a gallium nitride layer including gallium nitride (GaN). The gallium nitride included in the channel layer CH is preferably undoped gallium nitride. As another form, the channel layer CH can also be an indium gallium nitride (InGaN) layer.

Additionally, in the present embodiment, the channel layer CH is formed over the substrate SUB via the buffer layer BUF. As another form, a nitride semiconductor substrate including gallium nitride (GaN) or aluminum gallium nitride (AlGaN) can also be used for the substrate SUB, in which case the channel layer CH can also be formed by making the buffer layer BUF thinner, or without using the buffer layer BUF. This is possible because using a nitride semiconductor substrate including gallium nitride (GaN) or aluminum gallium nitride (AlGaN) or the like the substrate SUB allows the buffer layer BUF or the channel layer CH including gallium nitride to be formed over the nitride semiconductor substrate in a lattice-matched manner.

The barrier layer (electron supply layer) BR, including a nitride semiconductor which is different from the nitride semiconductor for the channel layer CH, is formed by a nitride semiconductor preferably containing aluminum (Al). For barrier (electron supply layer) BR, an aluminum gallium nitride layer including aluminum gallium nitride (AlGaN) can be preferably used in particular. As another form, the barrier layer (electron supply layer) BR can also be an aluminum indium gallium nitride layer including aluminum indium gallium nitride (AlInGaN).

The barrier layer BR is a nitride semiconductor layer having a different composition from the channel layer CH, and thus is a nitride semiconductor layer having a different band gap from the band gap of the channel layer CH. Specifically, the barrier layer BR is a nitride semiconductor layer having a larger band gap than the band gap of the channel layer CH.

The barrier layer BR is formed in a manner directly contacting the channel layer CH, so that the channel layer CH and the barrier layer BR are in contact. Accordingly, a hetero junction having a conduction band and discontinuity is formed between the channel layer CH and the barrier layer BR. The barrier layer BR, being an electron supply layer, can function as a carrier generation region.

The cap layer (p-type cap layer, the p-type semiconductor layer) CP is partially formed over the barrier layer BR, and the gate electrode GE is formed over the cap layer CP. Namely, the gate electrode GE is formed over the barrier layer BR via the cap layer CP, the barrier layer BR and the gate electrode GE having the cap layer CP interposed therebetween.

The cap layer CP, being a p-type nitride semiconductor layer, preferably includes gallium nitride (GaN). Since the cap layer CP is a semiconductor layer exhibiting a p-type conductivity, the cap layer CP has p-type impurities such as magnesium (Mg), for example, introduced (doped) thereinto. A cap layer CP1 described below corresponds to the cap layer CP.

The nitride semiconductor layer NS is formed in a different region from the region where the cap layer CP is formed over the barrier layer BR. Specifically, the cap layer CP and the nitride semiconductor layer NS are adjacent in a plan view, and the nitride semiconductor layer NS is formed in a region where the cap layer CP is not formed over the barrier layer BR. A nitride semiconductor layer NS2 described below corresponds to the nitride semiconductor layer NS.

The source electrode SE and the drain electrode DE are respectively formed over the nitride semiconductor layer NS. However, the source electrode SE and the drain electrode DE are not integrally formed but separated from each other, and they are partially formed over the nitride semiconductor layer NS respectively, in a manner sandwiching the gate electrode GE therebetween. The gate electrode GE, the source electrode SE, and the drain electrode DE are separated from each other in a plan view. The gate electrode GE is formed in a manner contained in the cap layer CP in a plan view, the source electrode SE is formed in a manner contained in the nitride semiconductor layer NS in a plan view, and the drain electrode DE is formed in a manner contained in the nitride semiconductor layer NS in a plan view.

Since the nitride semiconductor layer NS is formed over the barrier layer BR, and the source electrode SE and the drain electrode DE are formed over the nitride semiconductor layer NS in a manner separated from each other, there arises a state in which the source electrode SE and the drain electrode DE are formed over the barrier layer BR via the nitride semiconductor layer NS. The barrier layer BR and the source electrode SE have the nitride semiconductor layer NS interposed therebetween, and the barrier layer BR and the drain electrode DE have the nitride semiconductor layer NS interposed therebetween.

The nitride semiconductor layer NS includes the same type of material as the cap layer CP. Accordingly, when the cap layer CP includes gallium nitride (GaN), the nitride semiconductor layer NS also includes gallium nitride (GaN). However, although the cap layer CP exhibits a p-type conductivity, the nitride semiconductor layer NS is in an intrinsic state or exhibits an n-type conductivity. Accordingly, it is preferable that the cap layer CP is formed by p-type gallium nitride (GaN) and the nitride semiconductor layer NS is formed by gallium nitride (GaN) in an intrinsic state or having an n-type conductivity. Here, an n-type conductivity indicates that the majority carriers are electrons. In addition, a p-type conductivity indicates that the majority carriers are holes. In addition, the intrinsic state is a state in which the density of electrons and the density of holes being the carriers are approximately the same or a state in which no carrier has been generated.

The same p-type impurities (e.g., Mg) as the p-type impurities (e.g., Mg) introduced (doped) into the cap layer CP are also introduced (doped) into the nitride semiconductor layer NS with an approximately same density. Here, the nitride semiconductor layer NS has a larger number of nitrogen (N) holes (number of holes per unit volume; density of nitrogen holes) than the cap layer CP. Since the nitrogen holes function as donors, the n-type carriers (electron carriers) generated by the nitrogen holes act in a manner compensating the p-type carriers (hole carriers) generated by the doped p-type impurities (e.g., Mg). That is, the cap layer CP does not have sufficient nitrogen (N) holes generated therein for compensating the p-type carriers resulting from the doped p-type impurities, and thus the cap layer CP exhibits a p-type conductivity. In contrast, the nitride semiconductor layer NS has sufficient nitrogen (N) holes generated therein for compensating the p-type carriers resulting from the doped p-type impurities, and thus the nitride semiconductor layer NS exhibits an intrinsic state or an n-type conductivity.

In the present embodiment, as well as the Second and Third Embodiments described below, intrinsic refers to a state in which the effective carrier concentration (when both p-type carriers and n-type carriers exist, their difference corresponds to the effective carrier concentration) is equal to or less than $1\times10^{15}/cm^3$. In addition, p-type refers to a state in which the effective carrier concentration is larger than $1\times10^{15}/cm^3$ and the majority carriers are of p-type (hole). In addition, n-type refers to a state in which the effective carrier concentration is larger than $1\times10^{15}/cm^3$ and the majority carriers are of n-type (electrons). Accordingly, the nitride semiconductor layer NS2 is in a state in which the effective carrier concentration is equal to or less than $1\times10^{15}/cm^3$ or in a state of exhibiting an n-type conductivity (electron carrier (Majority Carrier).

The source electrode SE, the drain electrode DE, and the gate electrode GE, all of which include a conductor, are formed by a metal film (single-body film or stacked layer film of metal), for example. The source electrode SE, the drain electrode DE, and the gate electrode GE extend in a substantially perpendicular direction to the surface of FIG. 1.

The gate electrode GE is located between the source electrode SE and the drain electrode DE in a plan view. Namely, the gate electrode GE is sandwiched between the source electrode SE and the drain electrode DE in a plan view. That is, the source electrode SE and the drain electrode DE separated from each other are formed over the barrier layer BR via the nitride semiconductor layer NS, and the gate electrode GE is formed via the cap layer CP over the barrier layer BR sandwiched between the source electrode SE and the drain electrode DE in a plan view. The source electrode SE and the drain electrode DE are ohmic coupled to the nitride semiconductor layer NS. When being Schottky-coupled to the cap layer CP, the gate electrode GE is preferable because gate leakage current can be reduced thereby.

Expressions such as "plan view", "in a planar manner", or "viewed from above" refer to a case of being viewed from a plane parallel to the main surface (top surface) of the substrate SUB (therefore, a plane parallel to the top surface of the channel layer CH).

In this way, a High Electron Mobility Transistor (HEMT) is formed. Such a high electron mobility transistor has two-dimensional electron gas (two-dimensional electron gas layer) DEG generated (formed) near the interface between the channel layer CH and the barrier layer BR. Namely, the band gap of (gallium nitride (GaN) constituting) the channel layer CH and the band gap of (aluminum gallium nitride (AlGaN) constituting) the barrier layer BR are different. Accordingly, a potential well which is lower than the Fermi level is generated near the interface between the channel layer CH and the barrier layer BR, due to the conduction band offset based on the difference of band gaps and the effect of piezoelectric polarization and spontaneous polarization existing in the barrier layer BR. As a result, electrons are accumulated in the potential well, and thus the two-dimensional electron gas (two-dimensional electron gas layer) DEG is generated near the interface between the channel layer CH and the barrier layer BR.

The source electrode SE and the drain electrode DE are electrically coupled to the two-dimensional electron gas (two-dimensional electron gas layer) DEG, respectively.

Note that, in FIG. 1, the two-dimensional electron gas (two-dimensional electron gas layer) DEG is schematically indicated by the dashed line.

Here, the high electron mobility transistor illustrated in FIG. 1 has the p-type cap layer CP formed under the gate electrode GE, and thus can have a positive threshold voltage, that is, can operate as a normally-off device.

Here, when the gate electrode GE is formed directly in contact with the barrier layer BR without the cap layer CP, the transistor has a negative threshold voltage, that is, can operate as a normally-on device. However, a power control transistor or the like is required to operate as a normally-off device. Accordingly, a normally-off device is realized by employing a structure having the p-type cap layer CP formed under the gate electrode GE.

When a nitride semiconductor is used for the channel layer CH and the barrier layer BR, the bottom of the potential well is lowered by a piezoelectric polarization and spontaneous polarization resulting from using a nitride semiconductor, in addition to the potential well due to the conduction band offset between the channel layer CH and the barrier layer BR. As a result, the two-dimensional electron gas DEG is generated near the interface between the barrier layer BR and the channel layer CH even without applying voltage to the gate electrode GE in the absence of the cap layer CP. As a result, a normally-on device is brought about.

In contrast, as to the configuration of FIG. 1 in which the p-type cap layer CP is formed under the gate electrode GE, the conduction band of the barrier layer BR is raised by negative charge due to ionization of the acceptor of the p-type cap layer CP. As a result, in a thermal equilibrium state, it is possible not to form two-dimensional electron gas in the channel layer CH. Accordingly, a normally-off device can be realized by the transistor having the configuration illustrated in FIG. 1. With a normally-off device, there is no two-dimensional electron gas (DEG) existing immediately under the gate electrode GE in a state in which no voltage is applied to the gate electrode GE.

<Manufacturing Process of the Semiconductor Device>

A manufacturing process of the semiconductor device of the present embodiment will be described, referring to FIGS.

Figure 2:
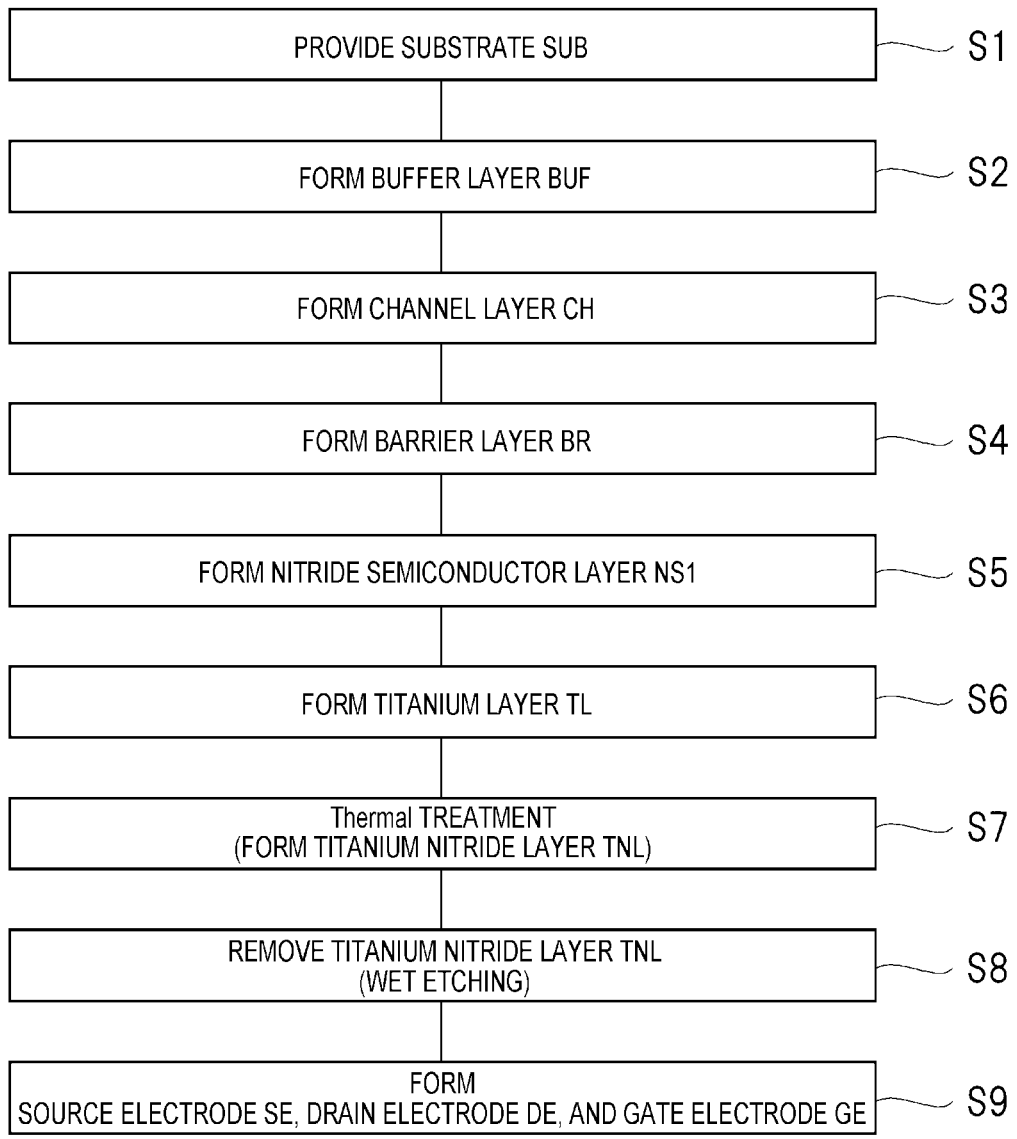
FIG. 2 is a process flow diagram illustrating a manufacturing process of a semiconductor device of an embodiment.

2 to 22. FIG. 2 is a process flow diagram illustrating the manufacturing process of the semiconductor device of the present embodiment. FIGS. 3 to 22 are main part cross-sectional views illustrating the manufacturing process of the semiconductor device of the present embodiment, in which a cross-sectional views of a region corresponding to FIG. 1 are illustrated.

Figure 3:
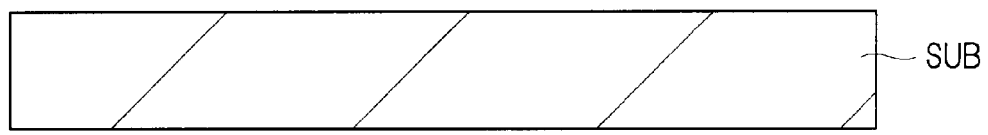
FIG. 3 is a main part cross-sectional view of a semiconductor device during a manufacturing process according to an embodiment.

In order to manufacture the semiconductor device of FIG. 1, the substrate SUB is first provided (step S1 of FIG. 2), as illustrated in FIG. 3.

Although the substrate SUB is a semiconductor substrate including, for example, silicon (Si) (single crystal silicon substrate), a sapphire substrate or a silicon carbonate (SiC) substrate can be used as other forms. In addition, a nitride semiconductor substrate including gallium nitride (GaN) or aluminum gallium nitride (AlGaN) can also be used as the substrate SUB, in which case the buffer layer BUF can be made thinner, or even unnecessary, because the substrate SUB and the subsequently formed channel layer CH can be lattice-matched.

Figure 4:
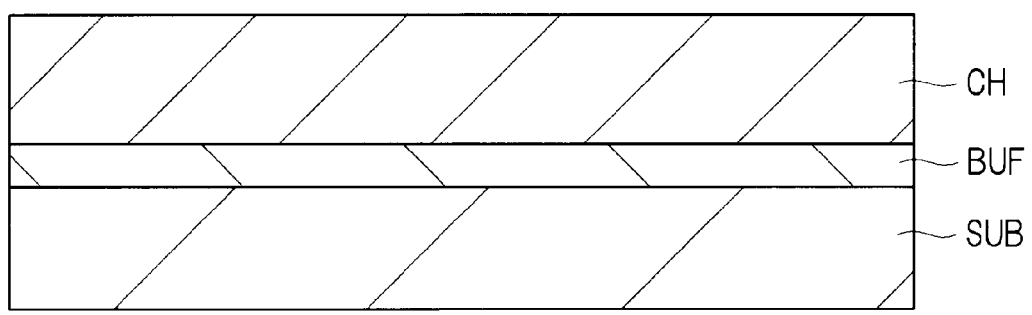
FIG. 4 is a main part cross-sectional view of the semiconductor device during the manufacturing process following FIG. 3.

Next as illustrated in FIG. 4, the buffer layer BUF which is an epitaxial layer is formed over the substrate SUB using MOCVD (Metal Organic Chemical Vapor Deposition), for example, (step S2 of FIG. 2). The buffer layer BUF is formed for the purpose of relaxing the lattice constant difference between the substrate SUB and the channel layer CH formed over the buffer layer BUF, for example.

Subsequently, the channel layer CH which is an epitaxial layer including undoped (non-doped) gallium nitride (GaN) is formed over the buffer layer BUF using MOCVD, for example (step S3 of FIG. 2). The thickness of the channel layer CH can be about 1 to 2 µm, for example. Although gallium nitride (GaN) is preferable as the material of the channel layer CH, indium gallium nitride (InGaN) can also be used as another form.

Figure 5:
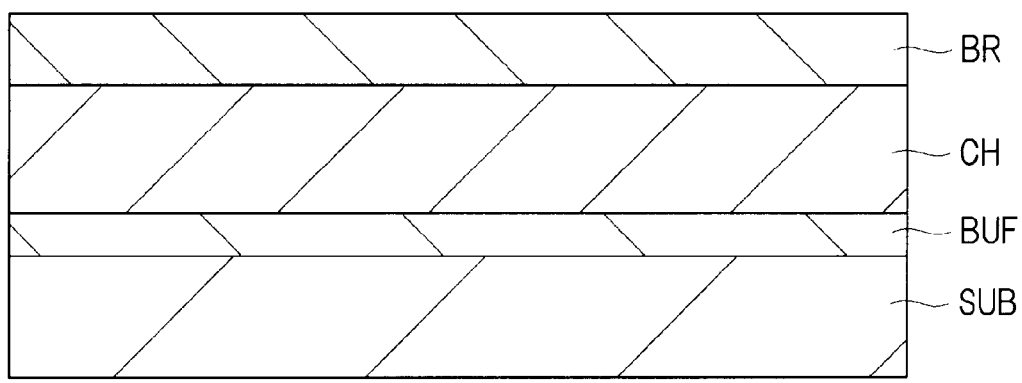
FIG. 5 is a main part cross-sectional view of the semiconductor device during the manufacturing process following FIG. 4.

Then, as illustrated in FIG. 5, the barrier layer BR, which is an epitaxial layer including undoped (non-doped) aluminum gallium nitride (AlGaN), is formed over the channel layer CH using MOCVD (step S4 of FIG. 2), for example. The thickness of the barrier layer BR can be about 5 to 30 nm, for example. Although aluminum gallium nitride (AlGaN) is preferable as the material of the barrier layer BR, aluminum indium gallium nitride (AlInGaN) can also be used as another form.

Figure 6:
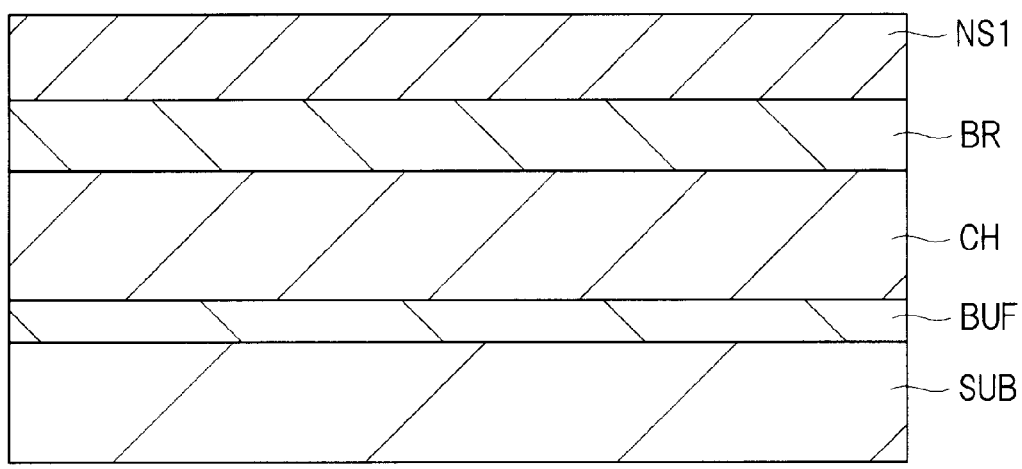
FIG. 6 is a main part cross-sectional view of the semiconductor device during the manufacturing process following FIG. 5.

Next, as illustrated in FIG. 6, the p-type nitride semiconductor layer NS1 is formed over the barrier layer BR (step S5 of FIG. 2). The nitride semiconductor layer NS1 preferably includes p-type gallium nitride (p-type GaN), and magnesium (Mg) or the like can be used as p-type impurities to be introduced (doped). The nitride semiconductor layer NS1, which is an epitaxial layer, can be formed using MOCVD, for example.

The Mg density and thickness of the p-type GaN layer (nitride semiconductor layer NS1) are matters of design to obtain the normally-off characteristic, and a thickness about 10 to 30 nm is preferable when the Mg density is about $1 \times 10^{19}$ $cm^{-3}$. As an example, the p-type GaN layer (nitride semiconductor layer NS1) can have an Mg density of about $2 \times 10^{19}$ $cm^{-3}$ and a thickness of about 20 nm, whereas the AlGaN (barrier layer BR) can have an Al composition of 0.2 and a thickness of about 18 nm.

With the processes up to step S5, there is obtained a structure in which the buffer layer BUF, the channel layer CH, the barrier layer BR, and the nitride semiconductor layer NS1 are formed (stacked), in the order from bottom to top, over the main surface of the substrate SUB (buffer layer BUF may be omitted). Accordingly, the processes up to step S5 can also be regarded as processes of providing a structure (stacked structure) having the substrate SUB, the channel layer CH formed over the substrate SUB, the barrier layer BR formed over the channel layer CH, and the nitride semiconductor layer NS1 formed over the barrier layer BR.

Figure 7:
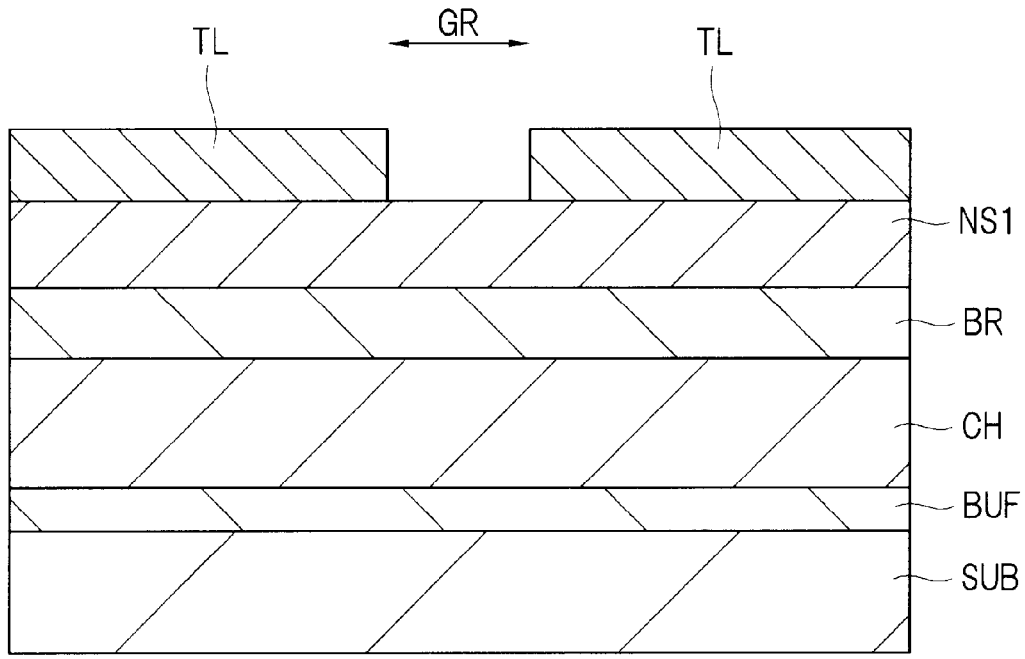
FIG. 7 is a main part cross-sectional view of the semiconductor device during the manufacturing process following FIG. 6.

Next, a titanium (Ti) layer TL is formed as a metal layer over the nitride semiconductor layer NS1 (step S6 of FIG. 2), as illustrated in FIG. 7. The titanium layer TL can be formed by sputtering or evaporation, for example.

Here, instead of forming the titanium layer TL over the entire top surface of the nitride semiconductor layer NS1, it is necessary to produce a state, as illustrated in FIG. 7, in which the titanium layer TL is not formed in a gate formation region GR of the top surface of the nitride semiconductor layer NS1, whereas the titanium layer TL is formed in a region other than the gate formation region GR. Note that the gate formation region GR corresponds to a region where the cap layer CP1 is subsequently formed. The subsequently formed gate electrode GE is formed over the cap layer CP1, and the gate electrode GE is contained in the cap layer CP1 in a plan view. Accordingly, the gate formation region GR includes, in a plan view, the region where the gate electrode GE is supposed to be formed later.

An exemplary technique for obtaining the structure of FIG. 7 having the titanium layer TL formed over the nitride semiconductor layer NS1 other than the gate formation region GR is provided in the following.

Figure 8:
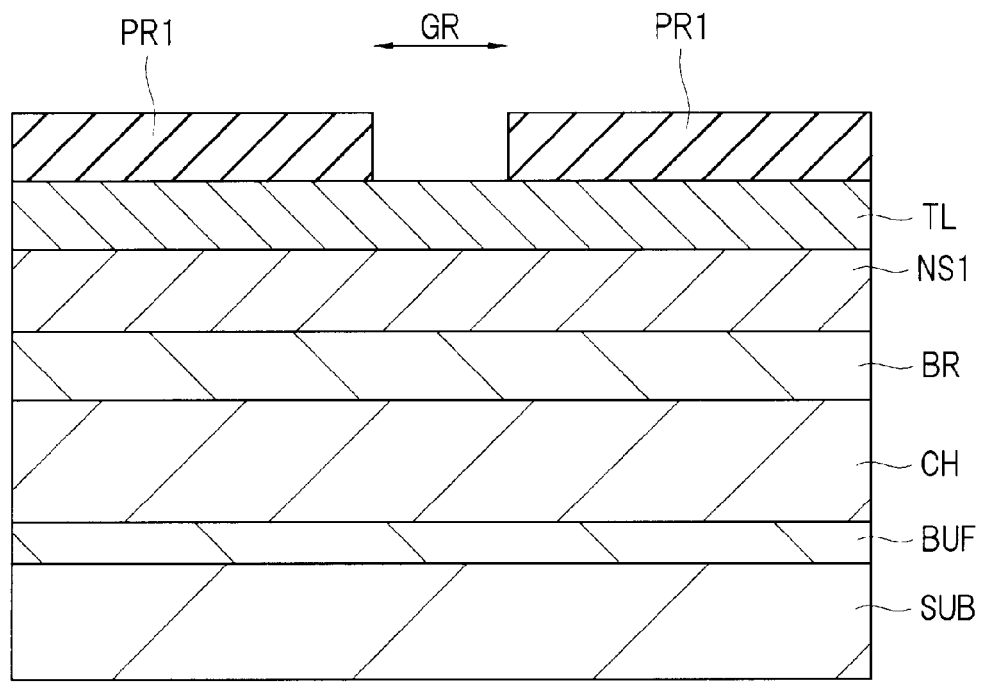
FIG. 8 is a main part cross-sectional view of the semiconductor device during the manufacturing process following FIG. 6.
Figure 9:
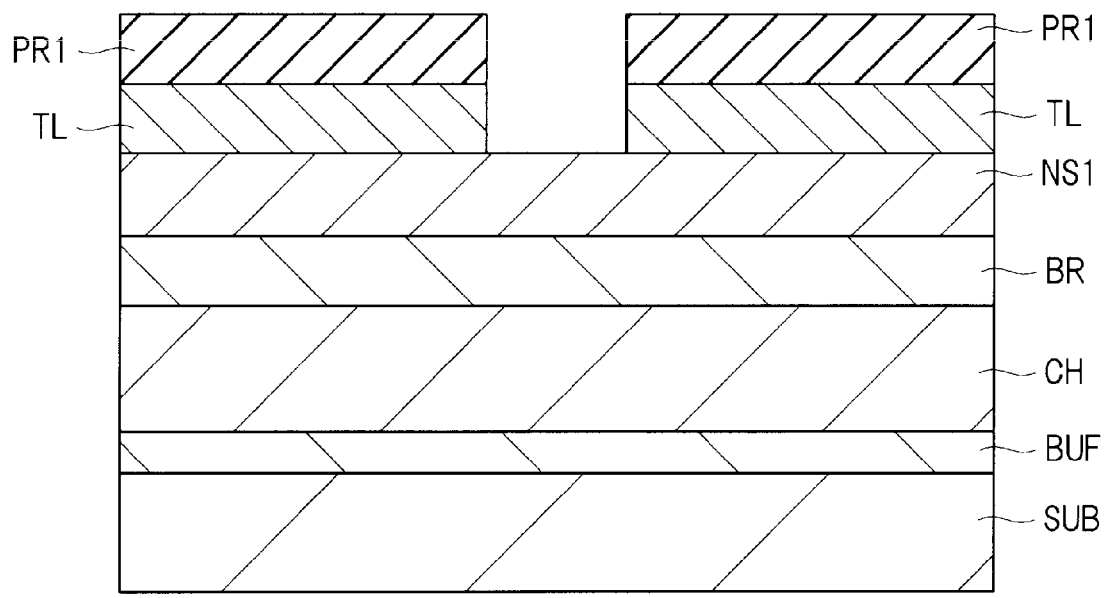
FIG. 9 is a main part cross-sectional view of the semiconductor device during the manufacturing process following FIG. 8.

That is, after having performed up to step S5 (nitride semiconductor layer NS1 formation process) to obtain the structure of FIG. 6, the titanium layer TL is formed over the entire top surface of the nitride semiconductor layer NS1 and a photoresist pattern PR1 is then formed over the titanium layer TL other than the gate formation region GR, as illustrated in FIG. 8. The photoresist pattern PR1 covers the titanium layer TL in a region other than the gate formation region GR, and exposes the titanium layer TL in the gate formation region GR. Subsequently, as illustrated in FIG. 9, the titanium layer TL of the gate formation region GR is removed by etching the titanium layer TL by using the photoresist pattern PR1 as a mask (etching mask). After that, by removing the photoresist pattern PR1, there is obtained the structure of FIG. 7 in which the titanium layer TL is not formed in the gate formation region GR over the top surface of the nitride semiconductor layer NS1, whereas the titanium layer TL is formed in a region other than the gate formation region GR.

In addition, another exemplary technique for obtaining the structure of FIG. 7 in which the titanium layer TL is formed over the nitride semiconductor layer NS1 other than the gate formation region GR is provided in the following (so-called lift-off method).

Figure 10:
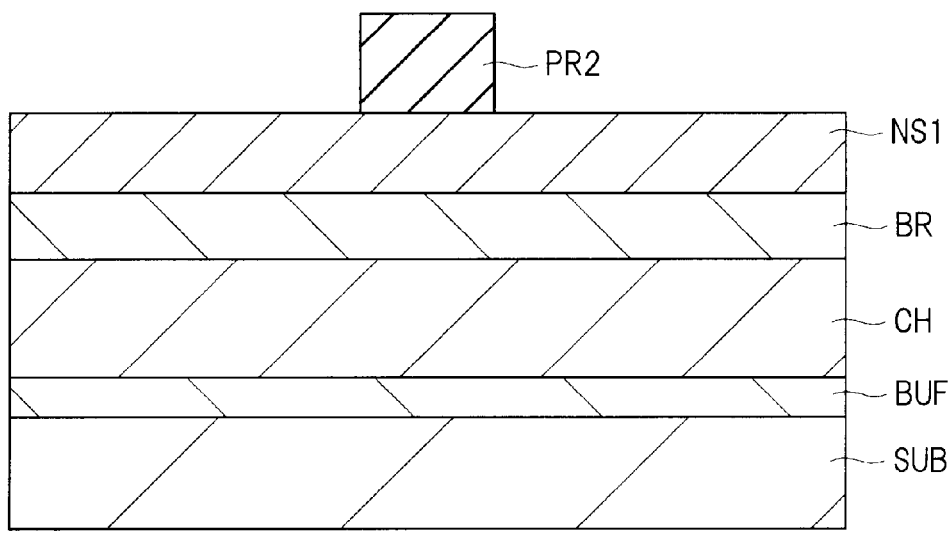
FIG. 10 is a main part cross-sectional view of the semiconductor device during the manufacturing process following FIG. 6.
Figure 11:
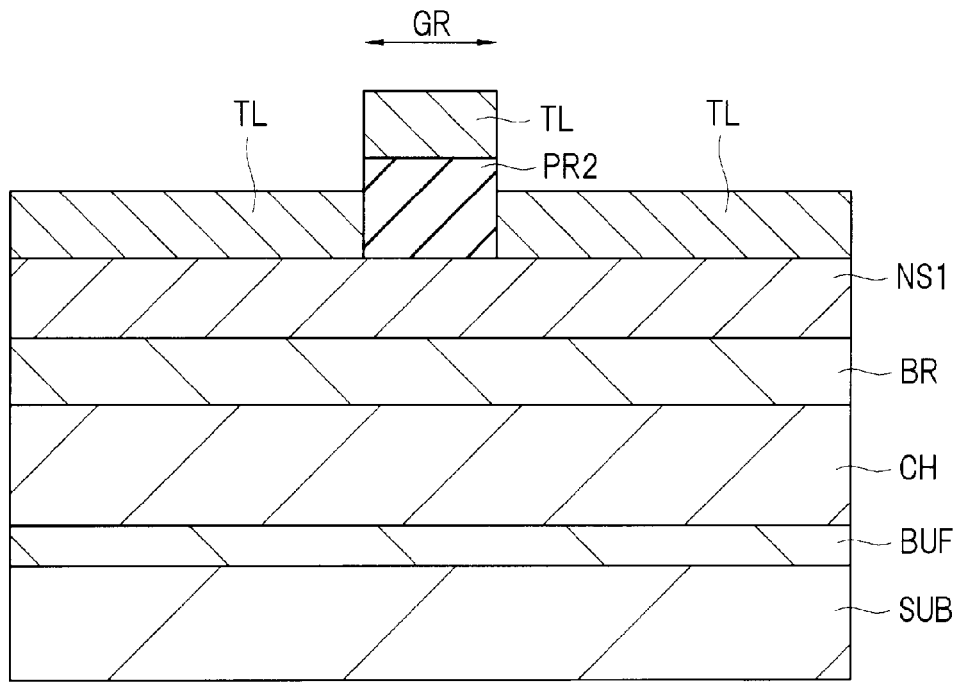
FIG. 11 is a main part cross-sectional view of the semiconductor device during the manufacturing process following FIG. 10.

That is, after having performed up to step S5 (nitride semiconductor layer NS1 formation process) to obtain the structure of FIG. 6, a photoresist pattern PR2 is formed over the nitride semiconductor layer NS1 by using the photolithography method, as illustrated in FIG. 10. The photoresist pattern PR2 is selectively formed in the gate formation region GR over the nitride semiconductor layer NS1. Subsequently, as illustrated in FIG. 11, the titanium layer TL is formed over the nitride semiconductor layer NS1 and over the photoresist pattern PR2. Thereafter, the titanium layer TL over the photoresist pattern PR2 is removed (lifted off) together with the photoresist pattern PR2. Accordingly, the titanium layer TL is formed over the nitride semiconductor layer NS1 in a region where the photoresist pattern PR2 is not formed (i.e., a region other than the gate formation region GR), whereas a structure is obtained in which the titanium layer TL is not formed over the nitride semiconductor layer NS1 in a region where the photoresist pattern PR2 has been formed (i.e., the gate formation region GR). That is, the structure of FIG. 7 is obtained in which the titanium layer TL is not formed in the gate formation region GR over the top surface of the nitride semiconductor layer NS1, whereas the titanium layer TL is formed in a region other than the gate formation region GR.

Figure 12:
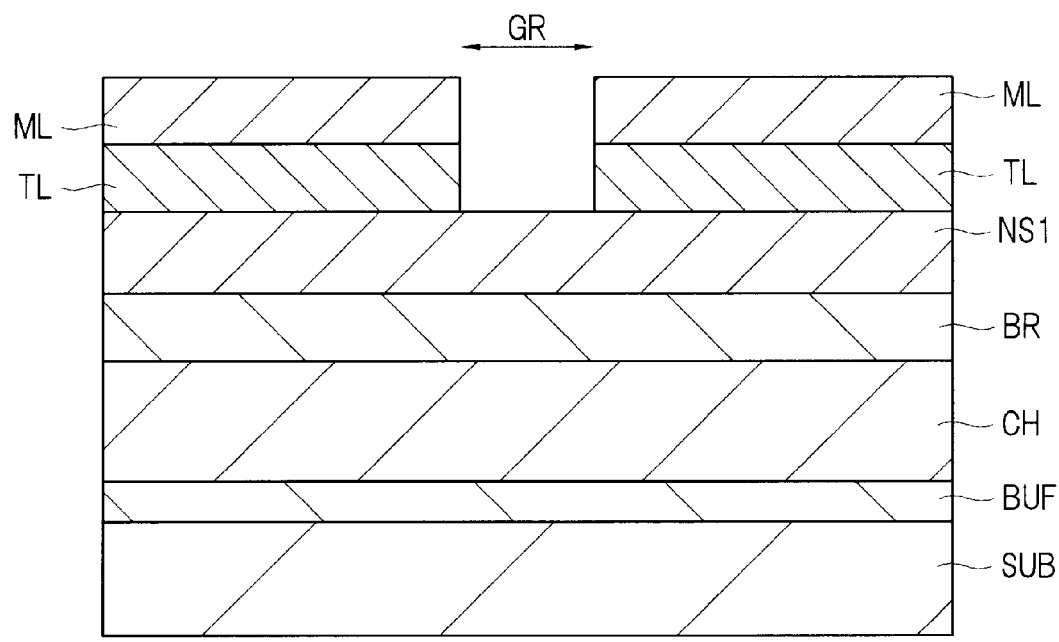
FIG. 12 is a main part cross-sectional view of the semiconductor device during the manufacturing process following FIG. 6.

In this way, the structure of FIG. 7 in which the titanium layer TL is formed over the nitride semiconductor layer NS1 other than the gate formation region GR can be obtained. The titanium layer TL can be formed as a single-body film (single layer). As another form, a stacked layer film including the titanium layer TL (stacked metal film including a plurality of metal layers including the titanium layer TL) can also be used in place of a single-body film of the titanium layer TL, in which case it is preferable that the bottom layer of the stacked layer film (i.e., the layer in contact with the nitride semiconductor layer NS1) is the titanium layer TL. For example, a stacked layer film of the titanium layer TL and a metal layer ML (stacked metal film) over the titanium layer TL can also be used in place of the single-body film of titanium (Ti) layer TL, as illustrated in FIG. 12. The metal layer ML can be formed by a different type of metal from the titanium layer TL and can be a single-layered metal layer or a multi-layered metal layer (stacked metal layer), which can be, for example, an aluminum (Al) layer. In FIG. 12, the top surface of the nitride semiconductor layer NS1 is in a state of having a stacked layer film (stacked metal film) of the titanium layer TL and the metal layer ML over the titanium layer TL formed in a region other than the gate formation region GR, whereas neither the titanium layer TL nor metal layer ML is formed in the gate formation region GR.

Figure 13:
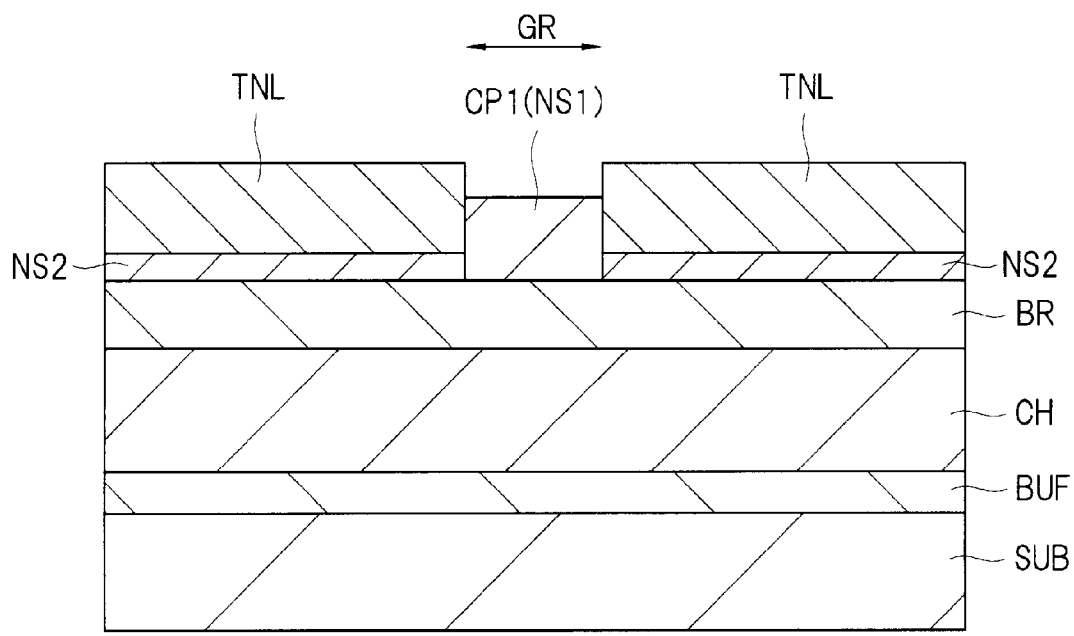
FIG. 13 is a main part cross-sectional view of the semiconductor device during the manufacturing process following FIG. 7.

Next, the titanium layer TL and the p-type nitride semiconductor layer NS1 are caused to react by performing thermal treatment (step S7 of FIG. 2). The thermal treatment of step S7 (thermal treatment used for making an alloy, an alloy treatment) causes the titanium layer TL to react (make an alloy) with the surface part of the nitride semiconductor layer NS1 to form a titanium nitride (TiN) layer TNL which is a reaction layer (alloyed layer) between the titanium layer TL and the nitride semiconductor layer NS1, as illustrated in FIG. 13. The titanium nitride layer TNL can be regarded as a metal nitride layer. In addition, although the titanium nitride layer TNL contains titanium (Ti) and nitrogen (N) as component elements, there may be a case where gallium (Ga) which has been included in the nitride semiconductor layer NS1 is further contained in addition to titanium (Ti) and nitrogen (N). The thermal treatment condition of step S7 may be, for example, a thermal treatment for about 30 seconds to 20 minutes at a temperature of 700 to 900° C. The atmosphere of thermal treatment can be, for example, inert gas atmosphere or nitrogen gas atmosphere.

After the thermal treatment of step S7, the nitride semiconductor layer NS2 remains under the titanium nitride layer TNL in a layered manner. That is, the formation thickness of the nitride semiconductor layer NS1 at step S5, the formation thickness of the titanium layer TL at step S6, and the thermal treatment condition at step S7 or the like are adjusted so that the nitride semiconductor layer NS2 remains under the titanium nitride layer TNL in a layered manner after the thermal treatment of step S7.

The nitride semiconductor layer NS2 is the nitride semiconductor layer NS1 remaining under the titanium nitride layer TNL, the nitride semiconductor layer NS2 includes the same type of nitride semiconductor as the nitride semiconductor layer NS1 before the thermal treatment of step S7 and, when the nitride semiconductor layer NS1 includes gallium nitride (GaN), the nitride semiconductor layer NS2 also includes gallium nitride (GaN). Since the titanium nitride layer TNL is generated by reaction between the surface layer part of the nitride semiconductor layer NS1 and the titanium layer TL, the thickness of the nitride semiconductor layer NS2 under the titanium nitride layer TNL has become smaller than the thickness of the nitride semiconductor layer NS1 before the thermal treatment of step S7. The nitride semiconductor layer NS2 corresponds to the nitride semiconductor layer NS of FIG. 1.

However, the conduction characteristics of the nitride semiconductor layer NS2 after the thermal treatment of step S7 is different from the conduction characteristics of the nitride semiconductor layer NS1 before the thermal treatment of step S7. That is, the nitride semiconductor layer NS1 before the thermal treatment of step S7, being p-type gallium nitride (GaN), has a p-type conductivity. This is because, the nitride semiconductor layer NS1 before the thermal treatment of step S7 with p-type impurities (e.g., Mg or the like) doped therein has the nature as a p-type semiconductor layer. In contrast, the nitride semiconductor layer NS2 after the thermal treatment of step S7 is in a state in which nitrogen (N) has escaped therefrom and nitrogen (N) holes have increased therein, compared with the nitride semiconductor layer NS1 before the thermal treatment of step S7. This is because nitrogen (N) is consumed although a reaction layer with the titanium layer TL (here, the titanium nitride layer TNL) is generated. Causing the titanium layer TL to react with the nitride semiconductor layer NS1 by the thermal treatment of step S7 leads to a state in which nitrogen (N) is absorbed to increase nitrogen (N) holes in the nitride semiconductor layer NS2 remaining under the titanium nitride TNL generated by the reaction.

Accordingly, in the case where the nitride semiconductor layer NS1 has been formed by gallium nitride, the nitride semiconductor layer NS2 after the thermal treatment of step S7 is formed by gallium nitride having nitrogen (N) escaped therefrom, that is, formed by gallium nitride having nitrogen (N) escaped therefrom and a large number of holes generated therein. The increase in nitrogen (N) holes leads to generation of n-type carriers (electron carriers) and enhancement of n-type operation. The n-type carriers due to nitrogen holes (N) and the p-type carriers due to doped p-type impurities (e.g., Mg) compensate each other. Accordingly, the nitride semiconductor layer NS2 does not function as a p-type semiconductor but functions as an intrinsic or n-type semiconductor. That is, the nitride semiconductor layer NS1 before the thermal treatment of step S7 is a p-type semiconductor layer, whereas the nitride semiconductor layer NS2 after the thermal treatment of step S7 is an intrinsic or n-type semiconductor layer.

As has been described above, intrinsic refers to a state in which the effective carrier concentration (when both p-type carriers and n-type carriers exist, their difference corresponds to the effective carrier concentration) is equal to or less than $1 \times 10^{15}/cm^3$. Accordingly, the nitride semiconductor layer NS2 after the thermal treatment of step S7 is in a state in which the effective carrier concentration is equal to or less than $1 \times 10^{15}/cm^3$ or in a state of exhibiting an n-type conductivity.

As thus described, although the nitride semiconductor layer NS2 after the thermal treatment of step S7 also includes p-type impurities (e.g., Mg), as with the nitride semiconductor layer NS1 before the thermal treatment of step S7, the nitride semiconductor layer NS2 after the thermal treatment of step S7 has increased nitrogen (N) holes therein, compared with the nitride semiconductor layer NS1 before the thermal treatment of step S7. That is, the nitride semiconductor layer NS2 has generated therein nitrogen (N) holes sufficient to be capable of compensating for the doped p-type impurities (e.g., Mg). Therefore, comparing the nitride semiconductor layer NS2 after the thermal treatment of step S7 with the nitride semiconductor layer NS1 before the thermal treatment of step S7, it turns out that although the density of p-type impurities (e.g., Mg) does not change very much, the nitride semiconductor layer NS1 functions as a p-type semiconductor layer and the nitride semiconductor layer NS2 functions as an intrinsic or n-type semiconductor layer, due to the difference of numbers of nitrogen (N) holes per unit volume.

In addition, since the titanium layer TL is not formed in the gate formation region GR when performing the thermal treatment of step S7, the titanium nitride layer TNL and the nitride semiconductor layer NS2 are not formed in the gate formation region GR, thereby leaving the nitride semiconductor layer NS1 intact to be formed into the cap layer CP1. That is, the nitride semiconductor layer NS1 in the gate formation region GR of the nitride semiconductor layer NS1 does not react with the titanium layer TL and remains intact to thereby be formed into the cap layer CP1. Accordingly, the cap layer CP1 is formed by the same nitride semiconductor as the nitride semiconductor layer NS1 and, when the nitride semiconductor layer NS1 includes gallium nitride (GaN), the nitride semiconductor layer NS2 also includes gallium nitride (GaN). The cap layer CP1 corresponds to the cap layer CP of FIG. 1.

In addition, since the titanium layer TL is not formed over the nitride semiconductor layer NS1 of the gate formation region GR, there is no significant change in the nitrogen (N) holes of the nitride semiconductor layer NS1 in the gate formation region GR before and after the thermal treatment of step S7 (i.e., does not change to an extent that the conductivity of the nitride semiconductor layer NS1 in the gate formation region GR changes from p-type to intrinsic or n-type). Accordingly, by reflecting that the nitride semiconductor layer NS1 before the thermal treatment of step S7 is a p-type semiconductor layer, the cap layer CP1 after the thermal treatment of step S7 (i.e., the nitride semiconductor layer NS1 of the gate formation region GR) is also a p-type semiconductor layer. That is, when the nitride semiconductor layer NS1 before the thermal treatment of step S7 is a p-type gallium nitride layer, the cap layer CP1 after thermal treatment of step S7 is also a p-type gallium nitride layer. The thickness of the cap layer CP1 is approximately equal to the thickness of the nitride semiconductor layer NS1 before the thermal treatment of step S7.

Therefore, a region of the nitride semiconductor layer NS1 having the titanium layer TL formed thereover (i.e., a region other than the gate formation region GR) reacts with the titanium layer TL in the thermal treatment of step S7, whereby the titanium nitride layer TNL is formed, with the nitride semiconductor layer NS2 in an intrinsic or n-type state remaining under the titanium nitride layer TNL in a layered manner. In addition, since a region of the nitride semiconductor layer NS1 not having the titanium layer TL formed thereover (i.e., the gate formation region GR) does not react with the titanium layer TL in the thermal treatment of step S7, the region remains as the p-type nitride semiconductor layer NS1. The p-type nitride semiconductor layer NS1 remaining in the gate formation region GR is formed into the cap layer CP1.

Although the thickness of the titanium nitride layer TNL to be formed is a matter of design that can be arbitrarily adjusted according to the thickness of the titanium layer TL, thermal treatment temperature, and thermal treatment time, a thicker titanium nitride TNL is formed when the titanium layer TL is thicker, or thermal treatment temperature is higher, or thermal treatment time is longer. The thickness of the titanium layer TL is preferable to be equal to or larger than 10 nm in order to cause a reaction in a substantially deep region of the nitride semiconductor layer NS1.

For example, in a case of forming, as the titanium layer TL over a p-type GaN layer (nitride semiconductor layer NS1), a stacked layer film of a titanium layer having a thickness of 40 nm and an aluminum layer having a thickness of 80 nm thereover, a titanium nitride layer having a thickness of 15 nm (titanium nitride layer TNL) is formed over a p-type GaN layer (nitride semiconductor layer NS1) having a thickness of 20 nm, by setting thermal treatment temperature to 850° C. and thermal treatment time to 60 seconds. The variation of the interface between the titanium nitride layer (TNL) and the GaN layer turned out to be within 1 nm, which is very steep.

Alternatively, a tantalum (Ta) layer can also be used in place of the titanium (Ti) layer TL. When using a tantalum (Ta) layer in place of titanium (Ti) layer TL, a tantalum nitride (TaN) layer is supposed to be formed in place of the titanium nitride layer TNL. However, since titanium (Ti) has a higher reactivity than tantalum (Ta) (i.e., easier to react with the nitride semiconductor layer to form a metal nitride layer), the titanium layer TL is more preferable than a tantalum layer.

In addition, the thermal treatment of step S7 can also act as activation annealing of the p-type impurities (e.g., Mg) introduced (doped) into the nitride semiconductor layer NS1, in which case the activation annealing process (thermal treatment) after growth (deposition) of the nitride semiconductor layer NS1 can be omitted.

Figure 14:
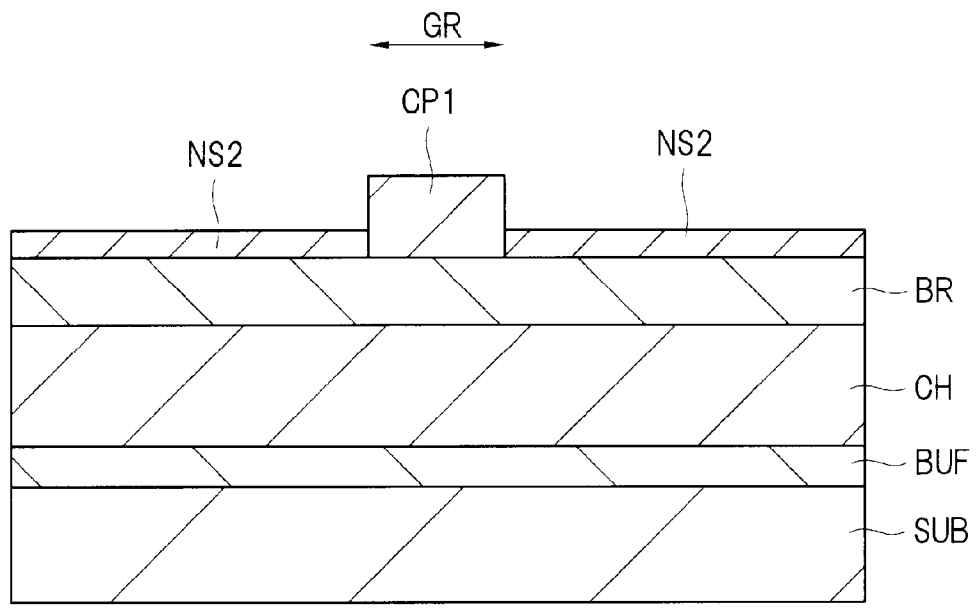
FIG. 14 is a main part cross-sectional view of the semiconductor device during the manufacturing process following FIG. 13.

Next, as illustrated in FIG. 14, the titanium nitride layer TNL is removed by wet etching (step S8 of FIG. 2). For example, the titanium nitride layer TNL can be removed by dipping it into hydrofluoric acid (HF) for a predetermined time (e.g., about 20 minutes). Besides hydrofluoric acid, aqua regia or the like, for example, can also be used as wet etching solution.

It is preferable for step S8 to perform etching under a condition (etching condition) in which the etching speed of the titanium nitride layer TNL becomes higher (faster) than the etching speed of the nitride semiconductor layers NS1 and NS2. Namely, it is preferable to perform etching at step S8 under a condition (etching condition) in which the etching speed of the nitride semiconductor layers NS1 and NS2 becomes lower (slower) than the etching speed of the titanium nitride layer TNL. That is, it is preferable to perform etching at step S8 under an etching condition in which etching of the nitride semiconductor layers NS1 and NS2 becomes more difficult than the titanium nitride layer TNL.

That is, it is preferable to employ, at step S8, an etching method which is capable of selectively removing the titanium nitride layer TNL while suppressing etching of the nitride semiconductor layers NS1 and NS2. From this viewpoint, wet etching is preferable. In addition, using wet etching allows suppressing or preventing etching damage more than dry etching.

Although gallium nitride (GaN) is little subjected to etching even by using hydrofluoric acid or aqua regia, the titanium nitride layer TNl resulting from reaction with the titanium layer TL can be etched by hydrofluoric acid or aqua regia. Taking advantage of this, it is possible to selectively remove the titanium nitride layer TNL, while suppressing etching of the gallium nitride layer.

Additionally, in the thermal treatment of step S7, there may be a case where a lower part of the titanium layer TL, instead of the entire thickness of the titanium layer TL reacting with the nitride semiconductor layer NS1, reacts with the nitride semiconductor layer NS1 to form the titanium nitride layer TNL and an upper part of the titanium layer TL does not react with the nitride semiconductor layer NS1. In this case, although an unreacted titanium layer TL remains over the titanium nitride layer TNL by performing the thermal treatment of step S7, the titanium nitride layer TNL and the unreacted titanium layer TL over the titanium nitride TNL are removed by the wet etching of step S8.

In the thermal treatment of step S7, however, it is more preferable that the entire thickness of the titanium layer TL reacts with the nitride semiconductor layer NS1 to form the titanium nitride layer TNL. In this case, the unreacted titanium layer TL does not remain over the titanium nitride layer TNL by performing the thermal treatment of step S7. Namely, it is more preferable to set the formation thickness of the titanium layer TL at step S6 or the thermal treatment condition of step S7 so that the unreacted titanium layer TL does not remain over the titanium nitride layer TNL after the thermal treatment of step S7. In this manner, the thickness of the titanium nitride layer TNL formed at step S7 can be controlled by the thickness of the titanium layer TL before the thermal treatment of step S7, whereby the thickness of the titanium nitride TNL to be formed hardly varies. Accordingly, the thickness of the nitride semiconductor layer NS2 becomes easy to control, as well as appropriately leaving the nitride semiconductor layer NS2 under the titanium nitride layer TNL. In this case, the titanium nitride layer TNL formed at step S7 is removed by the wet etching of step S8.

Figure 15:
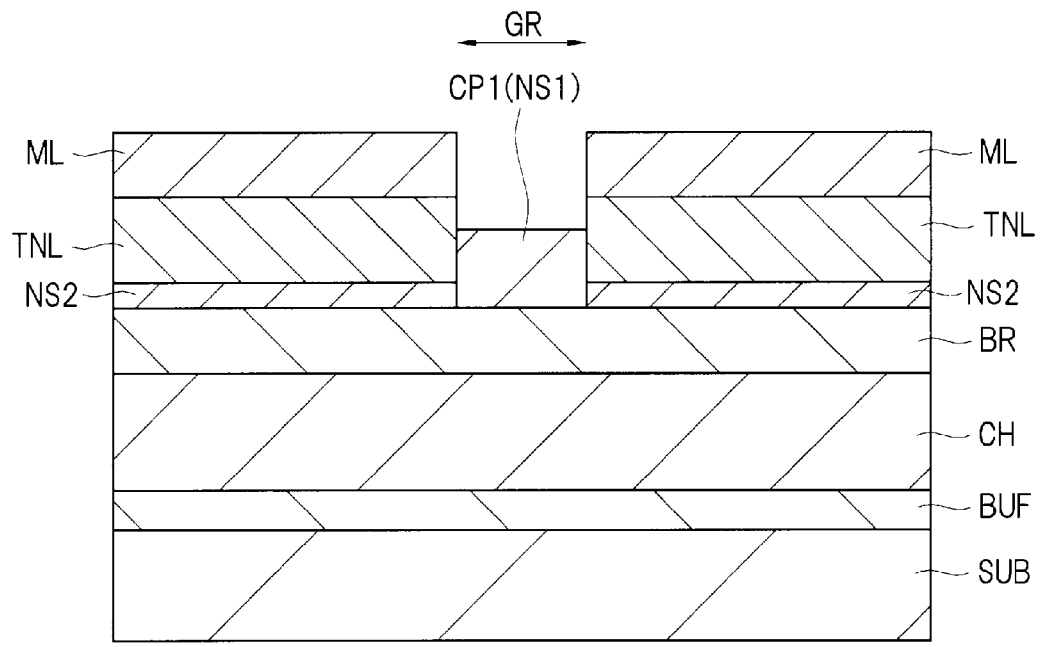
FIG. 15 is a main part cross-sectional view of the semiconductor device during the manufacturing process following FIG. 12.

Additionally, in a case where a stacked layer film including the titanium layer TL (stacked metal film having the titanium layer TL at the bottom layer) is used in place of the single-body film of the titanium layer TL, the titanium layer TL reacts with the nitride semiconductor layer NS1 by the thermal treatment of step S7 to form the titanium nitride layer TNL, and the metal layer located higher than the titanium layer TL remains over the titanium nitride layer TNL. In this case, the titanium nitride layer TNL and the metal layer remaining thereover are removed by the wet etching of step S8. For example, in a case where a stacked layer film of the titanium layer TL and a metal layer ML (e.g., aluminum layer) over the titanium layer TL is used in place of a single-body film of the titanium layer TL, as in FIG. 12, performing the thermal treatment of step S7 causes the titanium layer TL at the lower layer side to react with the nitride semiconductor layer NS1, whereby the titanium nitride layer TNL is formed, leaving the metal layer ML (e.g., aluminum layer) over the titanium nitride TNL, as illustrated in FIG. 15. In this case, the titanium nitride layer TNL and the metal layer ML (e.g., aluminum layer) remaining thereover are removed by the wet etching of step S8, whereby the structure of FIG. 14 is obtained.

After the wet etching of step S8, there arises a state in which the nitride semiconductor layer NS2 and the cap layer CP1 remain over the barrier layer BR. Namely, there arises a state in which the nitride semiconductor layer NS2 is formed over the barrier layer BR, that is, the surface (top surface) of the barrier layer BR is covered with the nitride semiconductor layer NS2, in a region where the titanium layer TL has been formed at steps S6 and S7 (i.e., a region other than the gate formation region GR). In addition, there arises a state in which the nitride semiconductor layer NS1 (cap layer CP1) is formed over the barrier layer BR, that is, the surface (top surface) of the barrier layer BR is covered with the nitride semiconductor layer NS1 (cap layer CP1), in a region where the titanium layer TL is not formed at steps S6 and S7 (i.e., the gate formation region GR). Therefore, the surface (top surface) of the barrier layer BR is not exposed by performing step S8. Accordingly, the surface (top surface) of the barrier layer BR will not be exposed after the nitride semiconductor layer NS1 has been formed at step S5, whereby oxidation of the surface (top surface) of the barrier layer BR can be prevented. The thickness of the nitride semiconductor layer NS2 remaining over the barrier layer BR after the wet etching of step S8 is smaller than the thickness of the cap layer CP1, and can be about 3 nm, for example.

Figure 16:
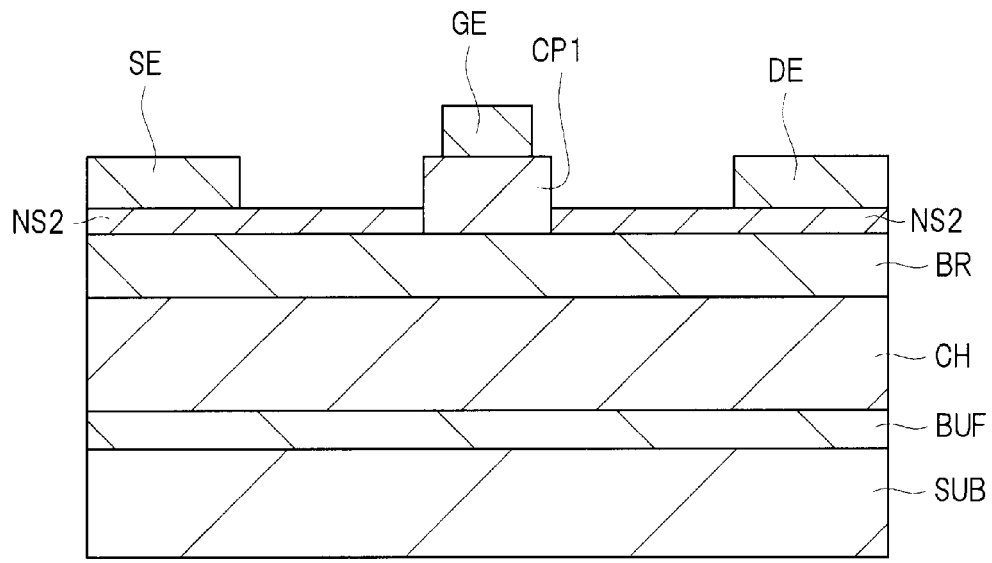
FIG. 16 is a main part cross-sectional view of the semiconductor device during the manufacturing process following FIG. 14.

Next, as illustrated in FIG. 16, the source electrode SE, the drain electrode DE, and the gate electrode GE are formed (step S9 of FIG. 2).

The source electrode SE and the drain electrode DE are formed over the nitride semiconductor layer NS2 over the barrier layer BR. Accordingly, there arises a state in which the source electrode SE and the drain electrode DE are formed over the barrier layer BR via the nitride semiconductor layer NS2. The gate electrode GE is formed over the cap layer CP1 over the barrier layer BR. Accordingly, there arises a state in which the gate electrode GE is formed over the barrier layer BR via the cap layer CP1.

The method of forming the source electrode SE, the drain electrode DE, and the gate electrode GE can use a variety of techniques. The followings (FIGS. 17 to 22) describe an example thereof.

Figure 17:
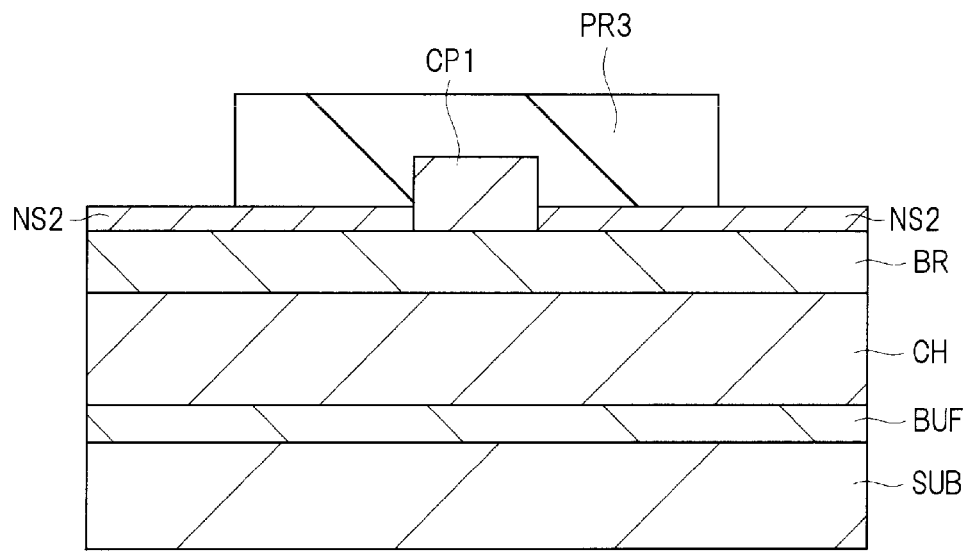
FIG. 17 is a main part cross-sectional view of the semiconductor device during the manufacturing process following FIG. 14.

Namely, after having performed up to step S8 (wet etching process) and obtained the structure of FIG. 14, a photoresist pattern PR3 is formed over the barrier layer BR by photolithography, as illustrated in FIG. 17. The photoresist pattern PR3 is formed in a manner exposing a region where the source electrode SE is supposed to be formed later and a region where the drain electrode DE is supposed to be formed later, and covering other regions.

Figure 18:
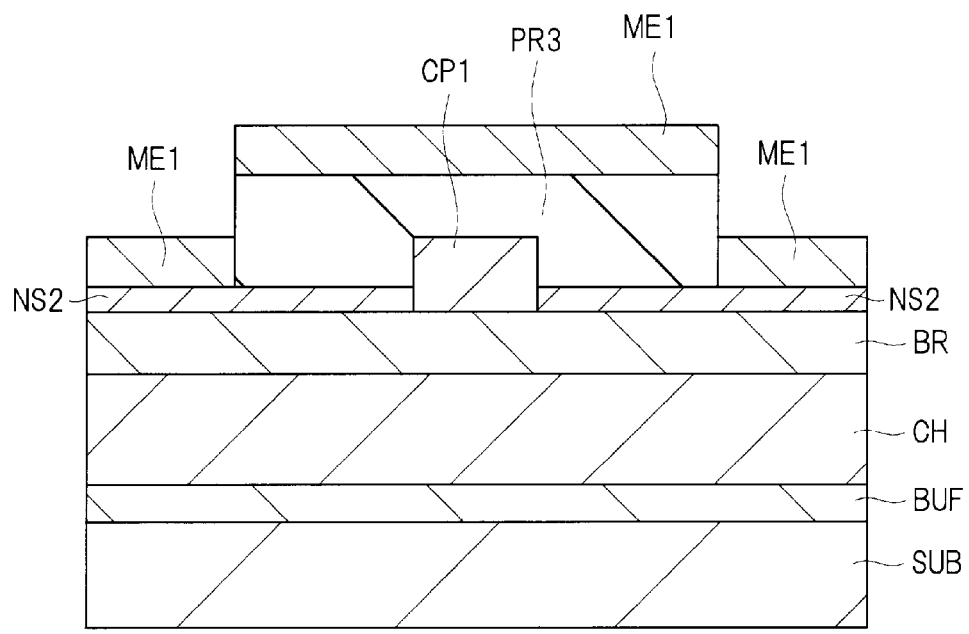
FIG. 18 is a main part cross-sectional view of the semiconductor device during the manufacturing process following FIG. 17.
Figure 19:
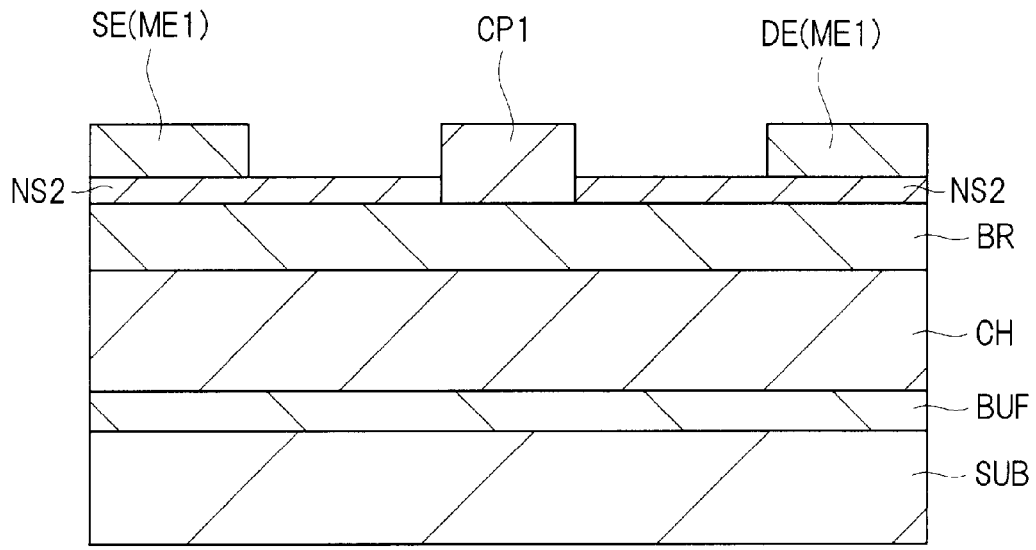
FIG. 19 is a main part cross-sectional view of the semiconductor device during the manufacturing process following FIG. 18.

Subsequently, as illustrated in FIG. 18, a metal layer ME1 for forming the source electrode SE and the drain electrode DE is formed by vapor-deposition over the photoresist pattern PR3 and the nitride semiconductor layer NS2 exposed from the photoresist pattern PR3. Thereafter, as illustrated in FIG. 19, the metal layer ME1 over the photoresist pattern PR3 is removed (lifted off) together with the photoresist pattern PR3. Accordingly, the source electrode SE and the drain electrode DE are formed, with the metal layer ME1 locally remaining in the region where the source electrode SE is supposed to be formed and the region where the drain electrode DE is supposed to be formed.

Although the source electrode SE and the drain electrode DE include, for example, a titanium (Ti) layer, an aluminum (Al) layer formed over the titanium layer, a nickel (Ni) layer formed over the aluminum layer, and a gold (Au) layer formed over the nickel layer (Ti/Al/Ni/Au), other configurations can also be employed. Although the source electrode SE and the drain electrode DE are formed in contact with the nitride semiconductor layer NS2 over the barrier layer BR, the source electrode SE and the drain electrode DE are separated from each other, bringing about a state in which the cap layer CP1 is sandwiched between the source electrode SE and the drain electrode DE. Subsequently, ohmic contact between the source electrode SE and the nitride semiconductor layer NS2 (or the barrier layer BR), and between the drain electrode DE and the nitride semiconductor layer NS2 (or the barrier layer BR) can also be facilitated by performing thermal treatment.

Figure 20:
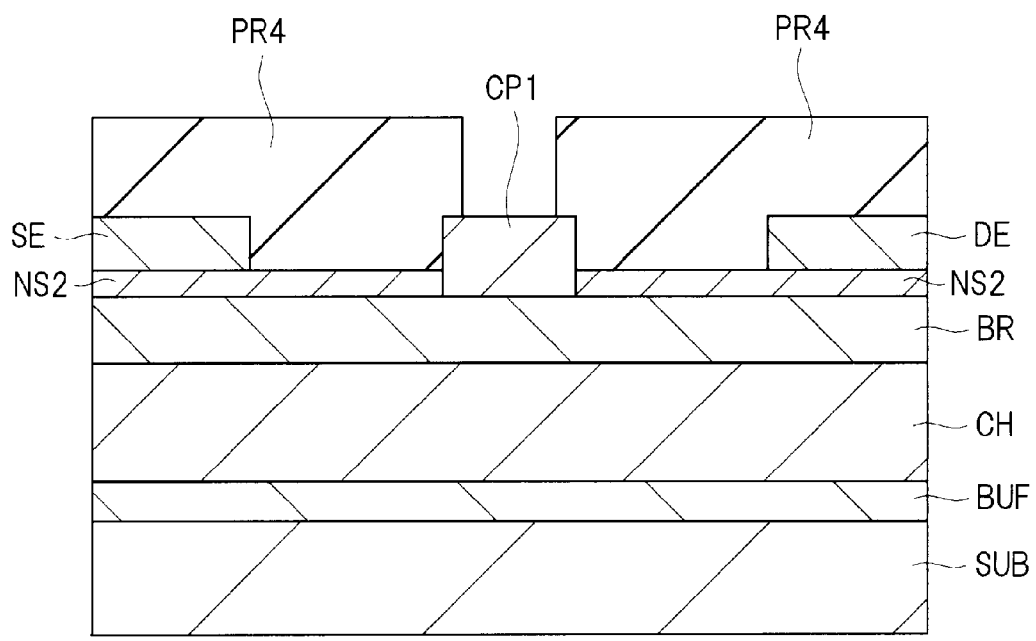
FIG. 20 is a main part cross-sectional view of the semiconductor device during the manufacturing process following FIG. 19.

Next, as illustrated in FIG. 20, a photoresist pattern PR4 is formed over the barrier layer BR using photolithography. The photoresist pattern PR4 is formed in a manner exposing the region where the gate electrode GE is supposed to be formed later, and covering other regions.

Figure 21:
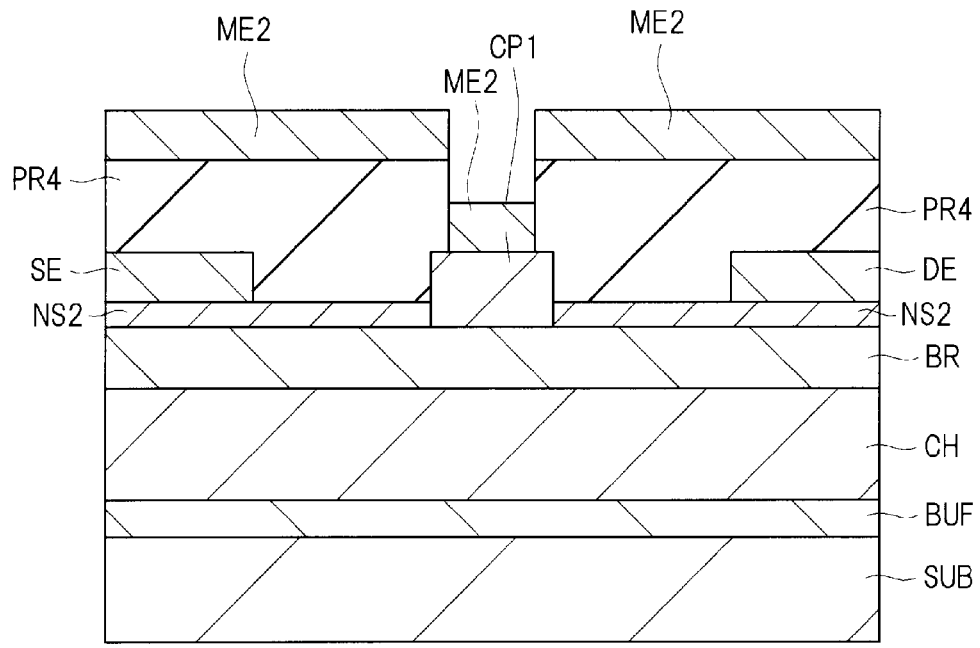
FIG. 21 is a main part cross-sectional view of the semiconductor device during the manufacturing process following FIG. 20.
Figure 22:
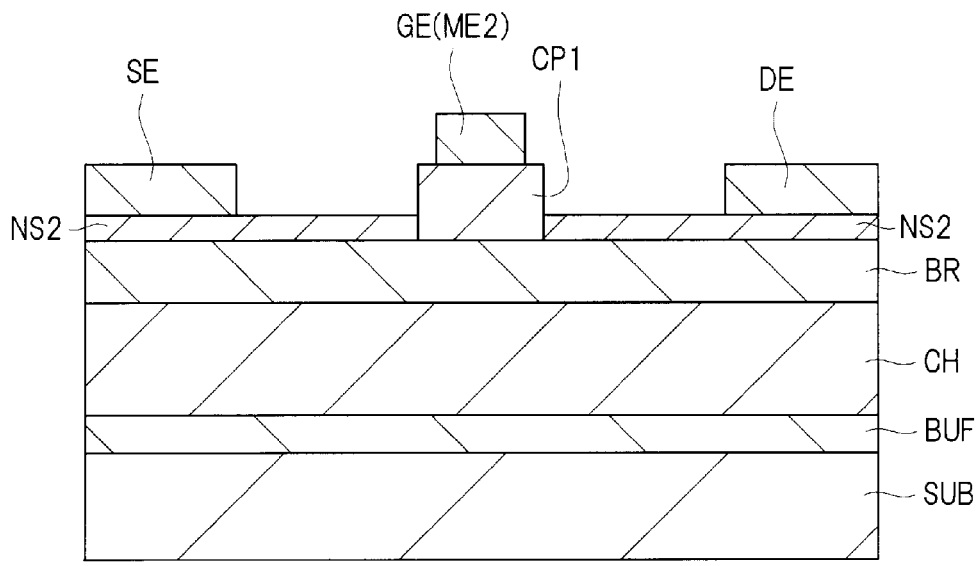
FIG. 22 is a main part cross-sectional view of the semiconductor device during the manufacturing process following FIG. 21.

Subsequently, as illustrated in FIG. 21, a metal layer ME2 for forming the gate electrode GE is formed over the photoresist pattern PR4 and the cap layer CP1 exposed from the photoresist pattern PR4 by vapor-deposition. Thereafter, illustrated in FIG. 22, the metal layer ME2 over the photoresist pattern PR4 is removed (lifted off) together with the photoresist pattern PR4. Accordingly, the gate electrode GE is formed, with the metal layer ME2 locally remaining in the region where the gate electrode GE is supposed to be formed. Although the gate electrode GE includes, for example, a nickel (Ni) layer and a gold (Au) layer formed over the nickel layer (Ni/Au), other configurations can also be employed. Although the gate electrode GE is formed in contact with the cap layer CP1 over the cap layer CP1 over the barrier layer BR, bringing about a state in which the gate electrode GE is sandwiched between the source electrode SE and the drain electrode DE.

In addition, after having been formed, the source electrode SE, the drain electrode DE, and the gate electrode GE may be covered with a silicon nitride film as a protection film or may have a wiring electrode formed thereover.

In this way, the high electron mobility transistor (semiconductor device) in the present First Embodiment can be manufactured.

<Manufacturing Process of Exemplary Semiconductor Device>

Next, an example considered by the present inventor of the present invention will be described. FIGS. 23 to 27 are main part cross-sectional views illustrating a manufacturing process of the exemplary semiconductor device.

In the exemplary manufacturing process, a case of forming a normally-off device will be described.

Figure 23:
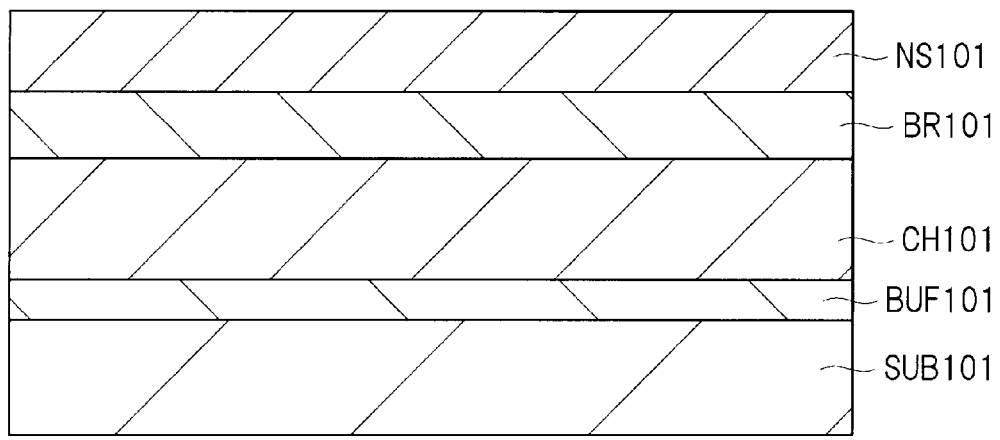
FIG. 23 is a main part cross-sectional view of an exemplary semiconductor device during a manufacturing process.

First, as illustrated in FIG. 23, a channel layer CH101 including gallium nitride (GaN) is formed over the substrate SUB101, via the buffer layer BUF101. Subsequently, a barrier layer BR101 including aluminum gallium nitride (AlGaN) is formed over the channel layer CH101. Subsequently, a p-type gallium nitride layer NS101 is formed over the barrier layer BR101. The p-type gallium nitride layer NS101, having magnesium (Mg) doped therein, is subject to thermal treatment (activation annealing) at about 700 to 800° C. for activation after growth.

Figure 24:
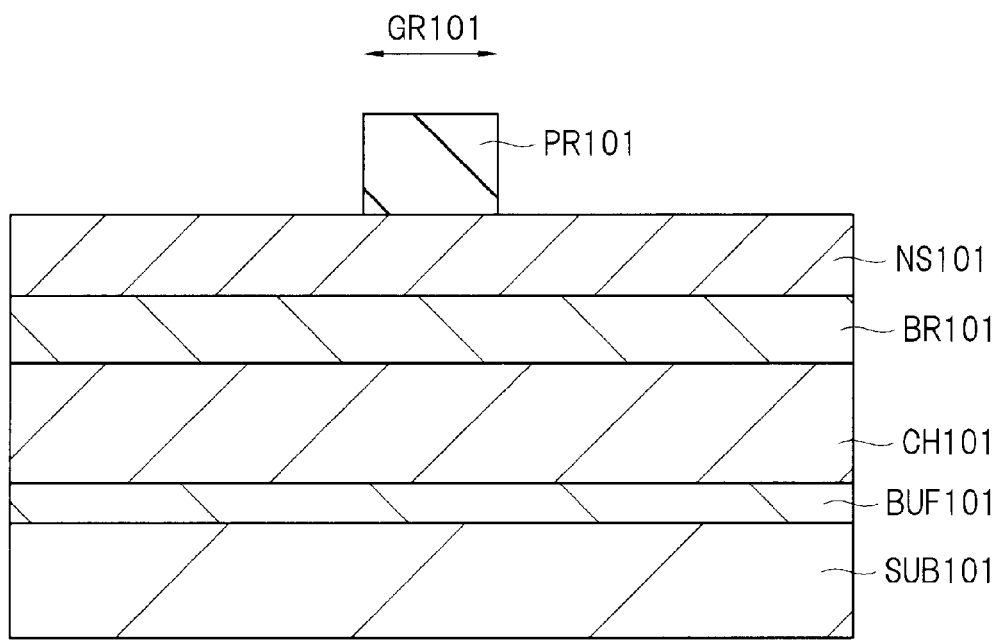
FIG. 24 is a main part cross-sectional view of the exemplary semiconductor device during the manufacturing process following FIG. 23.
Figure 25:
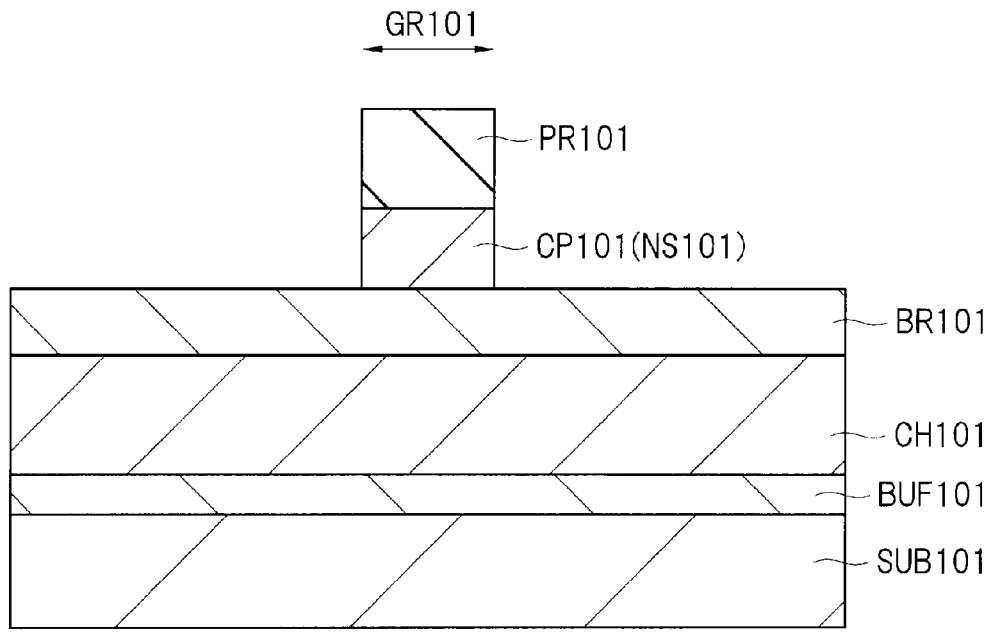
FIG. 25 is a main part cross-sectional view of the exemplary semiconductor device during the manufacturing process following FIG. 24.
Figure 26:
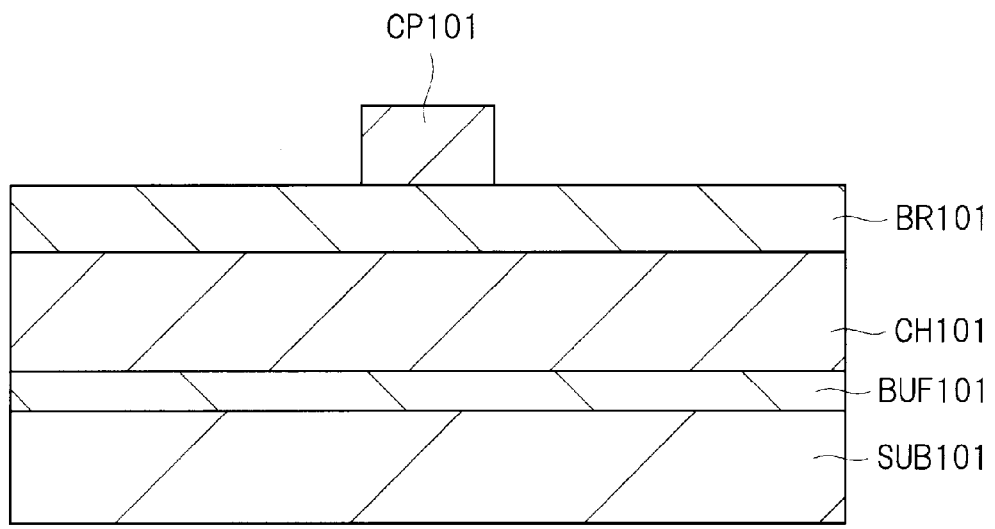
FIG. 26 is a main part cross-sectional view of the exemplary semiconductor device during the manufacturing process following FIG. 25.
Figure 27:
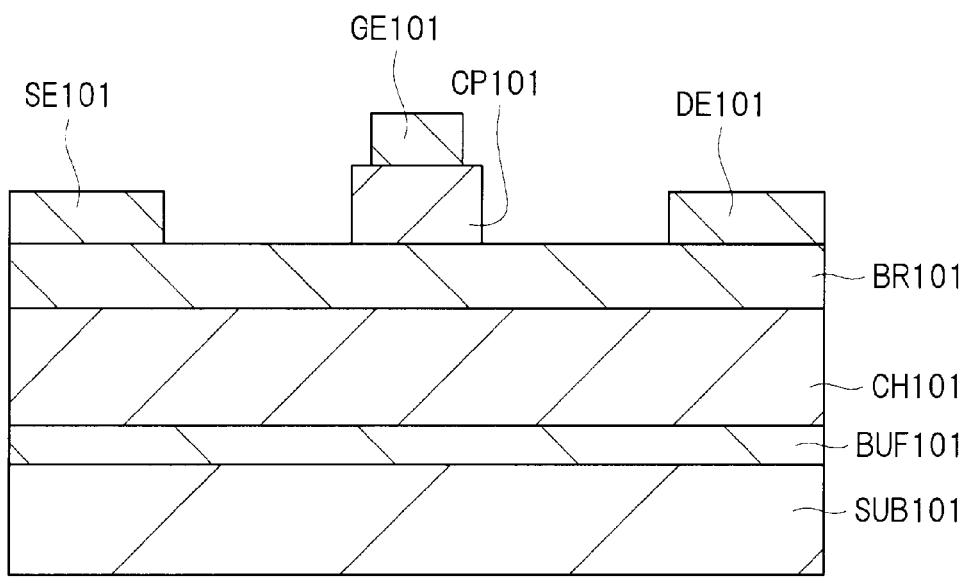
FIG. 27 is a main part cross-sectional view of the exemplary semiconductor device during the manufacturing process following FIG. 26.

Next, as illustrated in FIG. 24, a photoresist pattern PR101 is formed by photolithography over the p-type gallium nitride layer NS101. The photoresist pattern PR101 is formed selectively in the gate formation region GR101. Subsequently, as illustrated in FIG. 25, dry etching of the p-type gallium nitride layer NS101 is performed using the photoresist pattern PR101 as an etching mask. Accordingly, the unnecessary p-type gallium nitride layer NS101 other than the gate formation region GR101 is removed, with the p-type gallium nitride layer NS101 locally remaining in the gate formation region GR101 to thereby be formed into the cap layer CP101 including p-type gallium nitride. As the etching gas on this occasion, mixed gas of $Cl_2$ (chlorine gas) and $O_2$ (oxygen gas) which is capable of selective etching between aluminum gallium nitride (AlGaN) and gallium nitride (GaN) can be used, for example. Thereafter, as illustrated in FIG. 26, the photoresist pattern PR101 is removed. Thereafter, as illustrated in FIG. 27, the source electrode SE101 and the drain electrode DE 101 are formed over the barrier layer BR101, and the gate electrode GE101 is formed over the cap layer CP101. In this manner, a normally-off device can be manufactured.

In order to manufacture a normally-off device, it is necessary to remove, after formation of the p-type gallium nitride layer NS101, the unnecessary p-type gallium nitride NS101 layer (i.e., the p-type gallium nitride NS101 other than the part to be formed into the cap layer CP101).

Unlike gallium arsenic (GaAs), there is no useful selective wet etching technique for gallium nitride (GaN) and thus dry etching is used to remove the unnecessary p-type gallium nitride layer NS101, but it is difficult to remove precisely only the p-type gallium nitride layer NS101 by controlling the etching time. The unnecessary p-type gallium nitride layer NS101 remaining over the barrier layer BR101 reduces the two-dimensional electron gas between the gate and source, and between the gate and drain, increasing the ON-resistance thereby.

In order to prevent the above problem, although it is necessary to remove the p-type gallium nitride layer NS101 and perform over-etching up to the barrier layer BR101 when removing the unnecessary the p-type gallium nitride layer NS101 by dry etching, etching too deeply may cause thinning of the barrier layer BR101 and reduction of two-dimensional electron gas. In addition, dry etching is susceptible to damage, and thus defects which may cause electron trap are easily formed over the surface exposed by etching. Therefore, annealing is necessary for recovery of damage after dry etching. In addition, adjustment of gas mixing ratio is difficult when performing selective dry etching. Additionally, since the etching gas used for dry etching contains oxygen, the barrier layer BR101 (AlGaN) exposed to the surface is easily oxidized, which causes a problem such as increased ohmic contact resistance or easier occurrence f current collapse. Current collapse refers to a phenomenon in which the drain current increases as the voltage increases when a voltage (drain voltage) is applied between the source electrode and the drain electrode, whereas, when a large voltage stress is applied to the gate and the drain, less drain current flows than before application of the stress even if the drain voltage increases. This may lead to a reduced performance and reliability of the semiconductor device.

<Major Characteristics and Effects of Present Embodiment>

One of the major characteristics of the manufacturing process of the present embodiment lies in that wet etching, instead of dry etching, is used to remove the unnecessary part of the nitride semiconductor layer NS1 for forming the cap layer CP1. In this embodiment, the titanium layer TL is formed over the nitride semiconductor layer NS1 (step S6), thermal treatment is performed to cause a reaction between the titanium layer TL and the nitride semiconductor layer NS1 (step S7), and the generated reaction layer (titanium nitride layer TNL) is removed by wet etching (step S8).

Accordingly, the unnecessary nitride semiconductor layer NS1 (nitride semiconductor layer NS1 other than the region where the cap layer CP1 is formed) can be selectively removed by wet etching. Therefore, the cap layer CP1 can be precisely formed without using dry etching. Since the unnecessary nitride semiconductor layer NS1 can be removed without using dry etching, it is possible to prevent the barrier layer BR from being damaged by dry etching.

Namely, there is a concern that an attempt to perform wet etching of the p-type gallium nitride layer NS101 after the structure of FIG. 24 has been obtained cannot ensure the etching selection ratio and may not successfully perform etching of the p-type gallium nitride NS101, while an attempt to perform dry etching of the p-type gallium nitride layer NS101 after the structure of FIG. 24 has been obtained may result in etching damage.

The present embodiment can, in contrast, form the titanium layer TL over the nitride semiconductor layer NS1 (step 6), perform thermal treatment to cause a reaction between the titanium layer TL and the nitride semiconductor layer NS1 (step S7), and remove the generated reaction layer (titanium nitride layer TNL) by wet etching (step S8) to selectively remove the reaction layer (titanium nitride layer TNL). Accordingly, it is possible to selectively remove the unnecessary part of the nitride semiconductor layer NS1 by wet etching, as well as overcoming the defects in using dry etching. Therefore, the cap layer CP1 can be appropriately formed by the remaining part of the nitride semiconductor layer NS1. As a result, the performance of the semiconductor device can be enhanced. In addition, the reliability of the semiconductor device can be enhanced.

Additionally, in the present embodiment, since wet etching, instead of dry etching, is used to remove the unnecessary part of the nitride semiconductor layer NS1 for forming the cap layer CP1, it is not necessary to perform annealing for recovery from etching damage after the etching. In addition, the thermal treatment of step S7 can also act as activation annealing of the p-type impurities (e.g., Mg) which have been doped in the nitride semiconductor layer NS1.

In addition, another one of the major characteristics of the present embodiment is such that, in the region where the titanium layer TL is formed at step S6 (i.e., the region where the titanium layer TL is formed in the thermal treatment of step S7), the nitride semiconductor layer NS2 corresponding to the lower part of the nitride semiconductor layer NS1 remains over the barrier layer BR after wet etching of step S8.

Namely, the titanium layer TL is formed over the nitride semiconductor layer NS1 at step 6, and thermal treatment is performed at step S7 to cause a reaction between the titanium layer TL and the nitride semiconductor layer NS1. The lower part of the nitride semiconductor layer NS1 remains as the nitride semiconductor layer NS2 in a layered manner under the reaction layer (titanium nitride layer TNL) generated by the thermal treatment. The nitride semiconductor layer NS2 still remains over the barrier layer BR in a layered manner after the wet etching of step S8.

The nitride semiconductor layer NS2 corresponding to the lower part of the nitride semiconductor layer NS1 remaining over the barrier layer BR after the wet etching of step S8 can prevent the surface (top surface) of the barrier layer BR from being exposed. Accordingly, the surface (top surface) of the barrier layer BR can be prevented from being exposed and oxidized, suppressing or preventing occurrence of current collapse thereby. Therefore, the performance of the semiconductor device can be enhanced. In addition, the reliability of the semiconductor device can be enhanced.

If the surface of the barrier layer BR is exposed, there is a concern that occurrence of current collapse is facilitated. This is because, if the surface of the barrier layer BR is exposed and oxidized, a deep level is formed along with the oxidation to facilitate electron capture. The barrier layer BR, containing metallic elements such as aluminum (Al), is susceptible to oxidation when exposed, in comparison with nitride semiconductor layer (e.g., gallium nitride) which does not contain metallic elements such as aluminum (Al). In addition, oxidation of the surface of the barrier layer BR tends to facilitate occurrence of current collapse.

In contrast, with the present embodiment, the nitride semiconductor layer NS2 corresponding to the lower part of the nitride semiconductor layer NS1 remaining over the barrier layer BR after the wet etching of step S8 can prevent the surface (top surface) of the barrier layer BR from being exposed, whereby oxidization of the surface (top surface) of the barrier layer BR can be prevented. Accordingly, occurrence of current collapse due to oxidation of the surface (top surface) of the barrier layer BR can be prevented.

Namely, since the present embodiment can prevent the surface (top surface) of the barrier layer BR from being exposed after having formed the nitride semiconductor layer NS1 at step S5, it is possible to suppress or prevent defects (e.g., occurrence current collapse) due to oxidization of the surface (top surface) of the barrier layer BR.

Additionally, in the present embodiment, the source electrode SE and the drain electrode DE are formed over the nitride semiconductor layer NS2 remaining over the barrier layer BR after the wet etching of step S8 (step S9). If, unlike the present embodiment, the nitride semiconductor layer NS2 includes a p-type nitride semiconductor as with the cap layer CP1, there is a concern that the two-dimensional electron gas DEG decreases in the lower part of the nitride semiconductor layer NS2 and reduces the performance of the HEMT.

In contrast, the nitride semiconductor layer NS2 in the present embodiment is in a state of exhibiting intrinsic or an n-type conductivity. That is, the nitride semiconductor layer NS2 is in a state in which the effective carrier concentration is equal to or less than $1 \times 10^{15}/cm^3$ or in a state of exhibiting an n-type conductivity. Therefore, it is possible to suppress or prevent decrease of the two-dimensional electron gas DEG in the lower part of the nitride semiconductor layer NS2, whereby reduction of the performance of the HEMT falls can be suppressed or prevented. For example, increase of the ON-resistance of the HEMT can be suppressed or prevented. In contrast, the cap layer CP (CP1), including a nitride p-type semiconductor, can realize a normally-off device.

Additionally, in the manufactured semiconductor device, there is a concern of occurrence of current collapse if the thickness of the nitride semiconductor layer NS2 in the barrier layer BR is too small, whereas there is a concern of ohmic contact defect if the thickness is too large. From this viewpoint, the thickness of the nitride semiconductor layer NS2 over the barrier layer BR is preferable to be about 1 nm-5 nm in the manufactured semiconductor device.

In addition, in the present embodiment, not only the p-type cap layer CP1 but also the intrinsic or n-type nitride semiconductor layer NS2 is formed using the nitride semiconductor layer NS1 for the cap layer CP1. Namely, the p-type nitride semiconductor layer NS1 for the cap layer CP1 is formed at step S5, the titanium layer TL is formed over the nitride semiconductor layer NS1 at step 6, thermal treatment is performed at step S7 to cause a reaction between the titanium layer TL and the nitride semiconductor layer NS1. The thermal treatment of step S7 causes a reaction between nitrogen (N) in the nitride semiconductor layer NS1 and titanium (Ti) in the titanium layer TL to form the titanium nitride layer TNL, on which occasion nitrogen (N) and titanium (Ti) in the nitride semiconductor layer NS1 react and are absorbed, which results in formation, under the titanium nitride layer TNL, of the nitride semiconductor layer NS2 which is the nitride semiconductor layer NS1 having nitrogen (N) escaped therefrom and having holes formed therein. Accordingly, since the nitride semiconductor layer NS1 with p-type impurities (e.g., Mg) doped therein has been of p-type, the cap layer CP1 is of p-type and capable of realizing a normally-off device, and additionally, the nitride semiconductor layer NS2 having holes formed therein due to loss of nitrogen (N) therefrom can have an intrinsic or n-type conductivity. Accordingly, the p-type cap layer CP1 and the intrinsic or n-type nitride semiconductor layer NS2 can be appropriately formed, whereby a normally-off device can be realized, as well as improving the performance of the semiconductor device having a field effect transistor (HEMT).

As thus described, in the present embodiment, the cap layer CP1 (CP) and the nitride semiconductor layer NS2 are formed using the common nitride semiconductor layer NS1. Accordingly, the cap layer CP1 (CP) and the nitride semiconductor layer NS2 include the same type of material (preferably gallium nitride), and the cap layer CP1 (CP) has a p-type conductivity, whereas the nitride semiconductor layer NS2 has an intrinsic or n-type conductivity.

The present First Embodiment, and also the Second and Third Embodiments described below realize an etching that does not use dry etching by taking advantage of the nature that a nitride semiconductor such as gallium nitride (GaN) and titanium (Ti) react at a high temperature to form titanium nitride (metal nitride), and removing the formed titanium nitride TNL by wet etching using hydrofluoric acid or the like. In addition, with the First and the Second Embodiments described below, there can be obtained a device structure in which the barrier layer BR is prevented from being exposed and thus the barrier layer BR has a stable surface with little oxidation, by leaving a nitride semiconductor layer such as gallium nitride (GaN) over the surface of a region from which the titanium nitride layer TNL is removed after the wet etching of the titanium nitride layer TNL.

Additionally, in the present First Embodiment and the Second and the Third Embodiments described below, a tantalum (Ta) layer can also be used in place of the titanium (Ti) layer TL. When a tantalum (Ta) layer is used in place of the titanium (Ti) layer TL, a tantalum nitride (TaN) layer is supposed to be formed in place of the titanium nitride layer TNL. However, since titanium (Ti) has a higher reactivity than tantalum (Ta) (i.e., easier to react with a nitride semiconductor layer to form a metal nitride layer), the titanium layer TL is more preferable than the tantalum layer.

(Second Embodiment)

Figure 28:
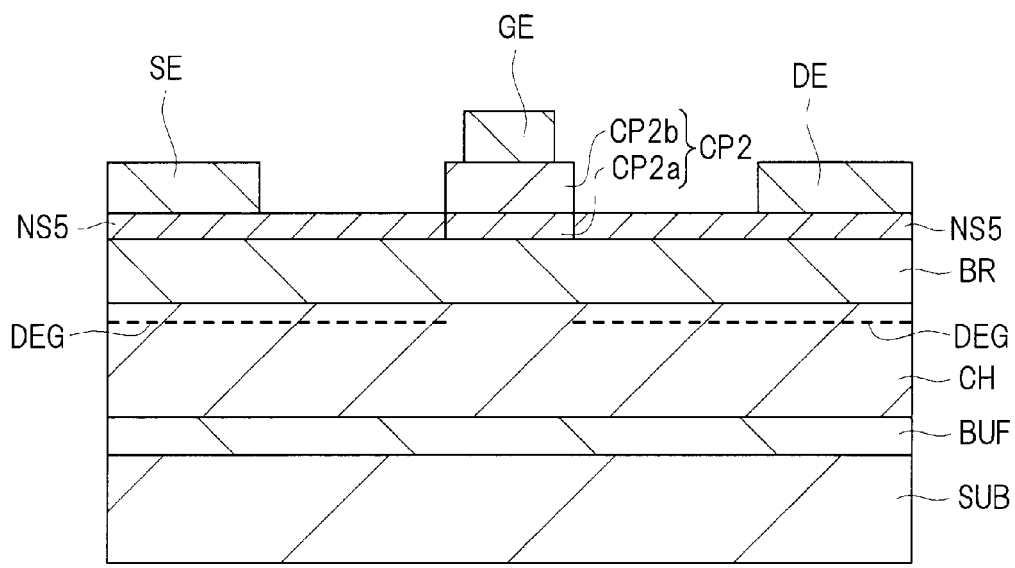
FIG. 28 is a main part cross-sectional view of a semiconductor device of another embodiment.

FIG. 28 is a main part cross-sectional view of a semiconductor device of the present Second Embodiment.

The semiconductor device of the present Second Embodiment illustrated in FIG. 28 differs from the semiconductor device of the First Embodiment illustrated in FIG. 1 in that the nitride semiconductor layer NS5 is formed in place of the nitride semiconductor layer NS2, and the cap layer CP2 is formed in place of the cap layer CP (CP1). Since the semiconductor device of the present Second Embodiment is basically the same as the semiconductor device of the First Embodiment, mainly their differences will be described here.

In the First Embodiment, the cap layer CP (CP 1) has been formed as a whole by a p-type nitride semiconductor (preferably p-type gallium nitride). In contrast, the cap layer CP2 of the present Second Embodiment is formed by an intrinsic nitride semiconductor layer CP2a and a p-type nitride semiconductor layer CP2b over the nitride semiconductor layer CP2a. That is, the cap layer CP2 has a stacked structure of the nitride semiconductor layer CP2a and the nitride semiconductor layer CP2b, the lower side (the side contacting the barrier layer BR) is the intrinsic nitride semiconductor layer CP2a, and the upper side (the side contacting the gate electrode GE) is the p-type nitride semiconductor layer CP2b. Accordingly, the gate electrode GE is formed over the barrier layer BR via the cap layer CP2, with the gate electrode GE being in contact with the nitride semiconductor layer CP2b but not being in contact with the nitride semiconductor layer CP2a, the nitride semiconductor layer CP2b being in contact with the nitride semiconductor layer CP2a but not being in contact with the barrier layer BR, and the nitride semiconductor layer CP2a being in contact with the barrier layer BR. The nitride semiconductor layer CP2b and the barrier layer BR have the nitride semiconductor layer CP2a interposed therebetween.

The nitride semiconductor layers CP2a and CP2b, including a nitride semiconductor, are preferably formed by gallium nitride (GaN). The nitride semiconductor layer CP2b, having p-type impurities (e.g., Mg) introduced (doped) thereinto as with the cap layer CP (CP1) of the First Embodiment, has a p-type conductivity. In contrast, the nitride semiconductor layer CP2a is formed by an undoped (non-doped) nitride semiconductor and has an intrinsic conductivity. Namely, the nitride semiconductor layer CP2a is in a state in which the effective carrier concentration is equal to or less than $1 \times 10^{15}/cm^3$.

In addition, although the nitride semiconductor layer NS2 described above has been in an intrinsic or n-type state in the First Embodiment, the nitride semiconductor layer NS5 is in an n-type state in the present Second Embodiment. Namely, the nitride semiconductor layer NS5 is in a state of exhibiting an n-type conductivity.

The nitride semiconductor layer NS5 includes the same type of material as the nitride semiconductor layer CP2a. Accordingly, when the nitride semiconductor layer CP2a includes gallium nitride (GaN), the nitride semiconductor layer NS5 also includes gallium nitride (GaN). However, although the nitride semiconductor layer CP2a is in an intrinsic state as described above, the nitride semiconductor layer NS5 is in an n-type state. Although the nitride semiconductor layer CP2a and the nitride semiconductor layer NS5 include an undoped nitride semiconductor (preferably, gallium nitride) having no conductive impurities doped therein, the nitride semiconductor layer NS5 has more nitrogen (N) holes (a larger number of holes per unit volume) than the nitride semiconductor layer CP2a, and thus the nitride semiconductor layer CP2a is in an intrinsic state and the nitride semiconductor layer NS5 is in an n-type state.

The semiconductor device of the present Second Embodiment is basically the same as the semiconductor device of the First Embodiment except for the foregoing.

Figure 29:
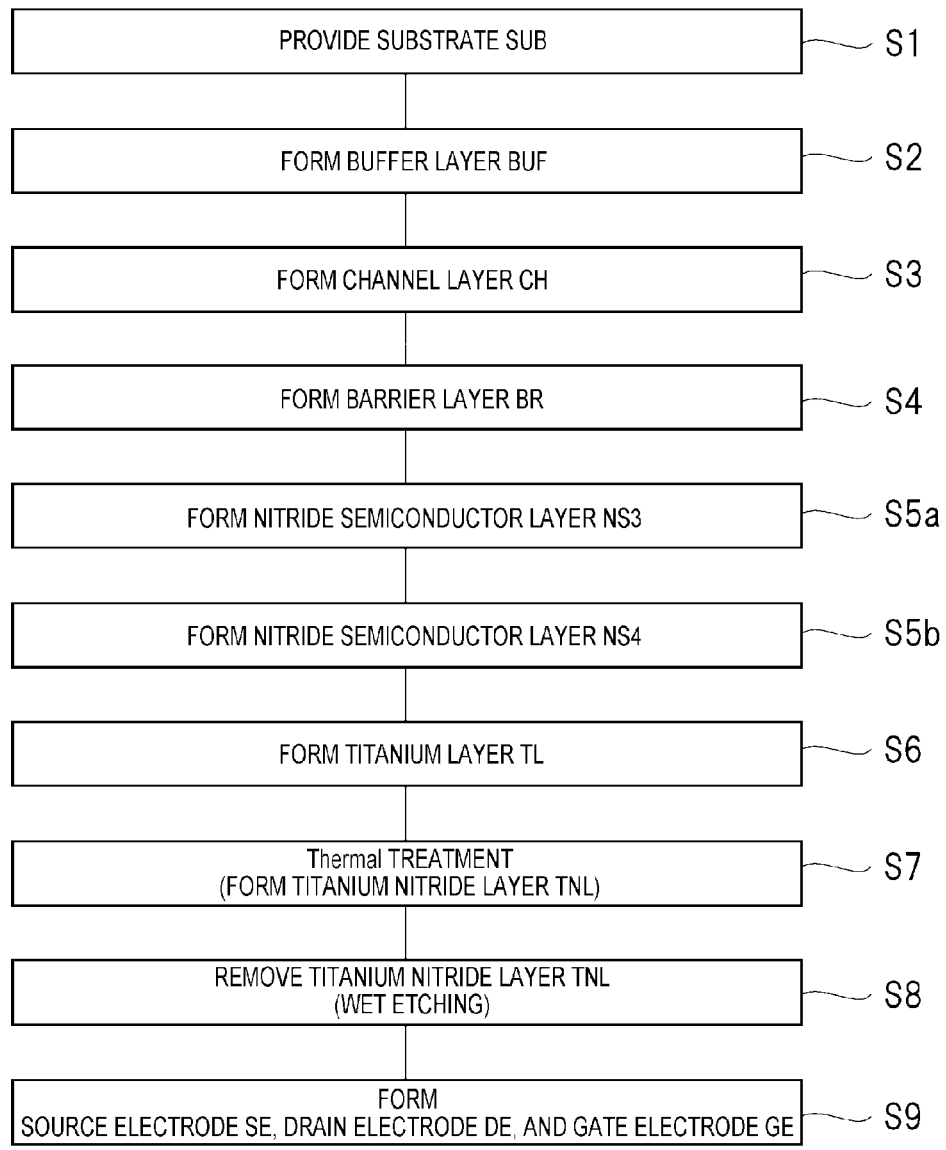
FIG. 29 is a process flow diagram illustrating a manufacturing process of a semiconductor device of another embodiment.

Next, a manufacturing process of the semiconductor device of the present Second Embodiment will be described, referring to FIGS. 29 to 34. FIG. 29 is a process flow diagram illustrating the manufacturing process of the semiconductor device of the present Second Embodiment. FIGS. 30 to 34 are main part cross-sectional views illustrating the manufacturing process of the semiconductor device of the Second Embodiment, in which a cross-sectional view of a region corresponding to FIG. 29 is illustrated.

The manufacturing process of the present Second Embodiment is similar to the First Embodiment as far as the barrier layer BR is formed at step S4 and the structure of FIG. 5 is obtained, and thus processes after step S4 (barrier layer RR formation process) will be described here.

Figure 30:
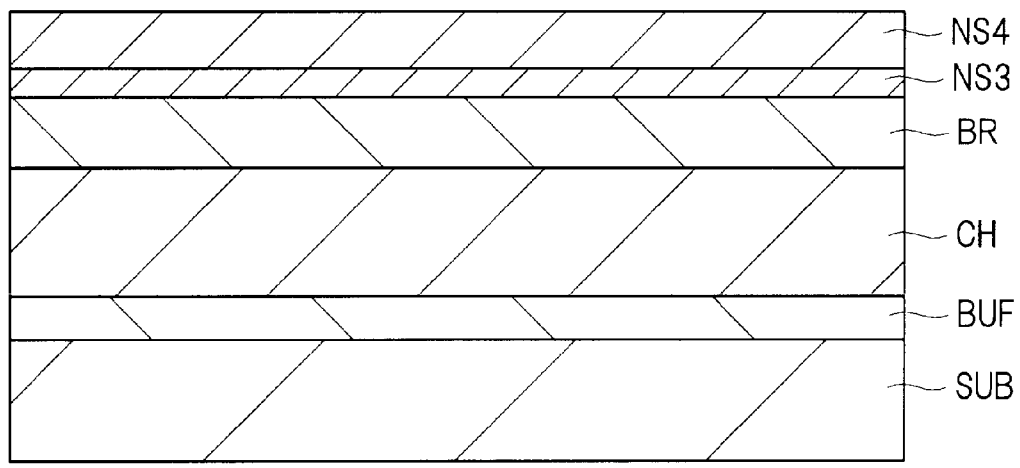
FIG. 30 is a main part cross-sectional view of a semiconductor device during a manufacturing process according to another embodiment.

After having performed steps S1 to S4 in a similar manner to the First Embodiment to obtain the structure of FIG. 5, an undoped (non-doped) nitride semiconductor layer NS3 is formed over the barrier layer BR in the present Second Embodiment, as illustrated in FIG. 30 (step S5a of FIG. 29). The nitride semiconductor layer NS3, preferably including gallium nitride (GaN), is undoped (non-doped) with no conductive impurities introduced thereinto. The nitride semiconductor layer NS3, which is an epitaxial layer, can be formed using MOCVD, for example. The thickness of the nitride semiconductor layer NS3 can be about 3 nm, for example.

Next, a p-type nitride semiconductor layer NS4 is formed over the nitride semiconductor layer NS3 (step S5b of FIG. 29). The nitride semiconductor layer NS3 preferably includes p-type gallium nitride (p-type GaN), for which magnesium (Mg) or the like can be used as p-type impurities to be introduced (doped). The nitride semiconductor layer NS3, which is an epitaxial layer, can be formed using MOCVD, for example. The thickness of the nitride semiconductor layer NS4 can be about 17 nm, for example. The impurities density of the nitride semiconductor layer NS4, and each thickness of the nitride semiconductor layers NS3 and NS4 may be set so that a normally-off characteristic is obtained.

Namely, although the nitride semiconductor layer NS1 has been formed over the barrier layer BR at step S5 in the First Embodiment, the nitride semiconductor layer NS3 and the nitride semiconductor layer NS4 are formed over the barrier layer BR in the order from bottom to top at steps S5a and S5b in the present Second Embodiment. The total thickness of the nitride semiconductor layers NS3 and NS4 can be set approximately equal to the thickness of, for example, the nitride semiconductor layer NS1, and the density of the p-type impurities (e.g., Mg) doped in the nitride semiconductor layer NS4 may be set approximately equal to that of, for example, the nitride semiconductor layer NS1.

Step S5a (nitride semiconductor layer NS3 deposition process) and step S5b (nitride semiconductor layer NS4 deposition process) can also be performed successively in a manner switching the deposition gas. For example, the nitride semiconductor layer NS4 can also be successively formed over the nitride semiconductor layer NS3 by depositing the nitride semiconductor layer NS3 to a predetermined thickness by using gallium nitride deposition gas which does not include the doping gas, and subsequently adding doping gas (doping gas for p-type impurities) to the gallium nitride deposition gas.

Figure 31:
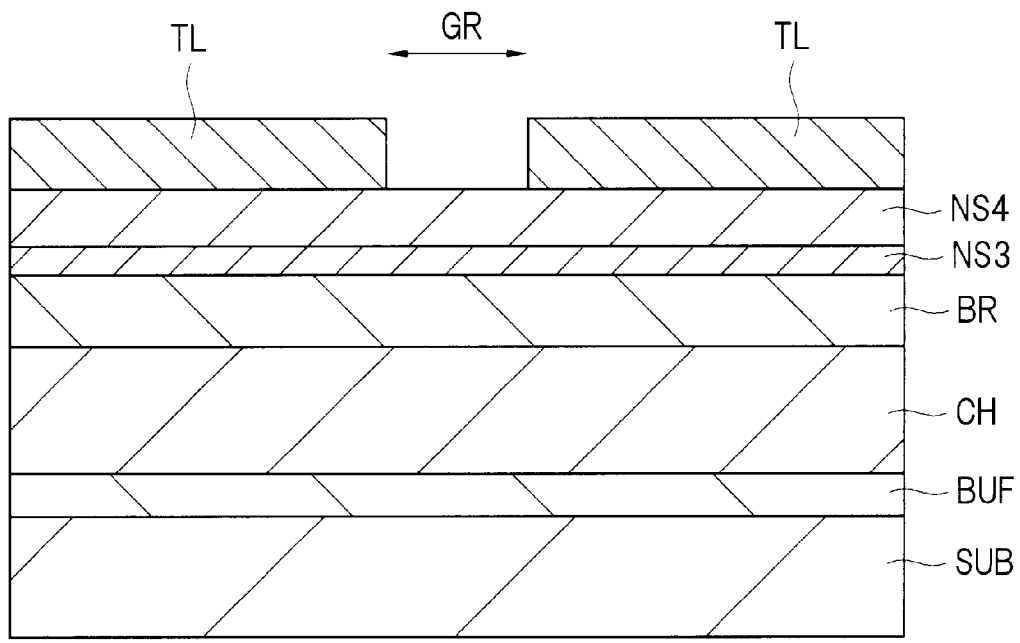
FIG. 31 is a main part cross-sectional view of the semiconductor device during the manufacturing process following FIG. 30.

Next, as illustrated in FIG. 31, a titanium (Ti) layer TL is formed as a metal layer over the nitride semiconductor layer NS4 (step S6 of FIG. 29). Step S6 (titanium layer TL formation process) of the present Second Embodiment is basically the same as that of the First Embodiment except that the titanium layer TL is formed over the nitride semiconductor layer NS4 instead of over the nitride semiconductor layer NS1.

Accordingly, as with the First Embodiment, there also arises a state in the present Second Embodiment in which the titanium layer TL in not formed in the gate formation region GR of the top surface of the nitride semiconductor layer NS4, whereas the titanium layer TL is formed in the region other than the gate formation region GR. As a method of realizing the foregoing, the method which has been described referring to FIGS. 8 and 9, or the method which has been described referring to FIGS. 10 and 11, for example can be applied. Additionally, in the present Second Embodiment, as with the First Embodiment, a stacked metal film having the titanium layer TL at the bottom layer can also be formed in place of the single-body film of the titanium layer TL.

Figure 32:
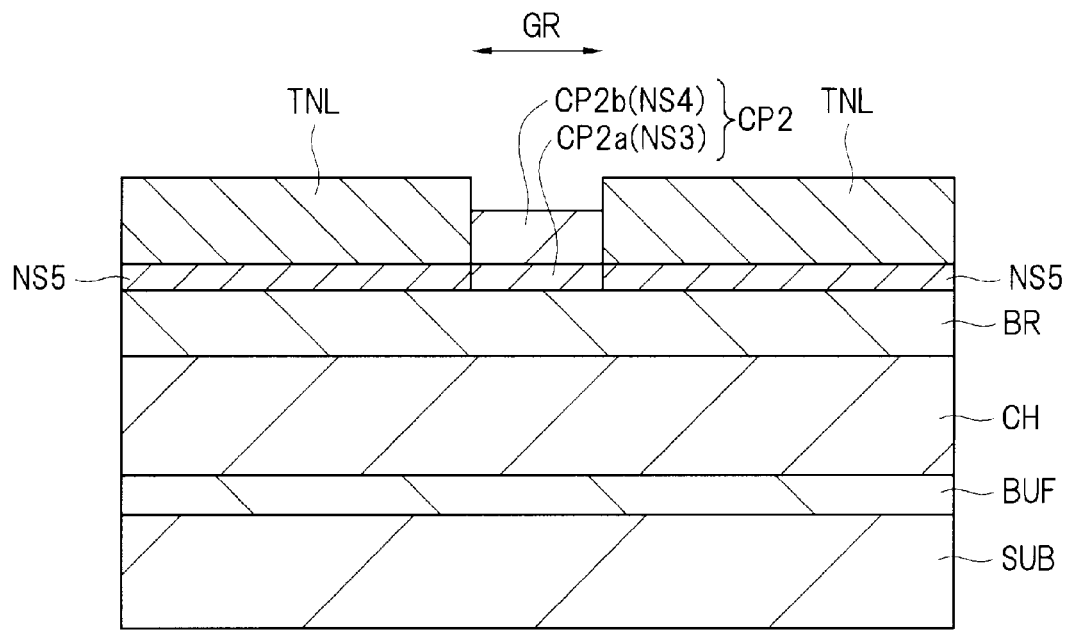
FIG. 32 is a main part cross-sectional view of the semiconductor device during the manufacturing process following FIG. 31.

Next, the titanium layer TL and the nitride semiconductor layer NS4 of p-type are caused to react by performing thermal treatment (step S7 of FIG. 29). The thermal treatment (thermal treatment for alloying, alloying process) of step S7 causes the titanium layer TL to react (make an alloy) with the nitride semiconductor layer NS4, and the titanium nitride (TiN) layer TNL, which is a reaction layer (alloying layer) of the titanium layer TL and the nitride semiconductor layer NS4, is formed as illustrated in FIG. 32. The titanium nitride layer TNL can be regarded as a metal nitride layer. In addition, although the titanium nitride layer TNL contains titanium (Ti) and nitrogen (N) as components, there may be a case where gallium (Ga) which has been included in the nitride semiconductor layer NS4 is further contained in addition to titanium (Ti) and nitrogen (N). The thermal treatment condition on this occasion can be a thermal treatment for about 30 seconds to 20 minutes at a temperature of, for example, 700 to 900° C. The atmosphere of thermal treatment can be, for example, an inert gas atmosphere or a nitrogen gas atmosphere.

The difference between the present Second Embodiment and the First Embodiment with regard to step S7 is that the titanium layer TL reacts (makes an alloy) with the nitride semiconductor layer NS1 to form the titanium nitride layer TNL in the First Embodiment, whereas, in the present Second Embodiment, the titanium layer TL reacts (makes an alloy) with the nitride semiconductor layer NS4 to form the titanium nitride layer TNL.

In addition, the First Embodiment has caused the nitride semiconductor layer NS2 to remain under the titanium nitride layer TNL in a layered manner after the thermal treatment of step S7. In contrast, the present Second Embodiment causes the nitride semiconductor layer NS5 to remain under the titanium nitride layer TNL in a layered manner after the thermal treatment of step S7. That is, each formation thickness of the nitride semiconductor layers NS3 and NS4 at steps S5a and S5b, the formation thickness of the titanium layer TL at step S6, and the thermal treatment condition at step S7 are adjusted so that the nitride semiconductor layer NS5 remains under the titanium nitride layer TNL in a layered manner after the thermal treatment of step S7.

The nitride semiconductor layer NS5, which is the nitride semiconductor layer NS3 remaining under the titanium nitride layer TNL, includes the same type of nitride semiconductor as the nitride semiconductor layer NS3 before the thermal treatment of step S7, and also includes gallium nitride (GaN) when the nitride semiconductor layer NS3 includes gallium nitride (GaN).

However, the conduction characteristics of the nitride semiconductor layer NS5 after the thermal treatment of step S7 is different from the conduction characteristics of the nitride semiconductor layer NS3 before the thermal treatment of step S7. That is, the nitride semiconductor layer NS3 before the thermal treatment of step S7 is undoped gallium nitride with an intrinsic conductivity. In contrast to this, the nitride semiconductor layer NS5 after the thermal treatment of step S7 is in a state where nitrogen (N) has escaped therefrom and nitrogen (N) holes have increased therein, compared with the nitride semiconductor layer NS3 before the thermal treatment of step S7.

In comparison with the nitride semiconductor layer NS3 before the thermal treatment of step S7, the nitride semiconductor layer NS5 after the thermal treatment of step S7 has nitrogen (N) escaped therefrom and nitrogen (N) holes increases therein. The reason thereof is similar to the reason why the nitride semiconductor layer NS2 after the thermal treatment of step S7 has nitrogen (N) escaped therefrom and increased nitrogen (N) holes, compared with the nitride semiconductor layer NS1 before the thermal treatment of step S7, in the First Embodiment. Therefore, explanation thereof is not repeated here.

When the nitride semiconductor layers NS3 and NS4 are formed by gallium nitride, the nitride semiconductor layer NS5 after the thermal treatment of step S7 is formed by gallium nitride having nitrogen (N) escaped therefrom, in other words, is formed by gallium nitride having nitrogen (N) escaped therefrom and a large number of holes generated therein. Increase of nitrogen (N) holes leads to generation of n-type carriers (electron carriers) and enhancement of n-type operation. Accordingly, the nitride semiconductor layer NS2 functions as an n-type semiconductor. Namely, although the nitride semiconductor layer NS3 before the thermal treatment of step S7 is an undoped semiconductor layer and has an intrinsic conductivity, the nitride semiconductor layer NS5 after the thermal treatment of step S7 is an n-type semiconductor layer and has an n-type conductivity.

In addition, since the titanium layer TL is not formed in the gate formation region GR when performing the thermal treatment of step S7, the titanium nitride layer TNL and the nitride semiconductor layer NS5 are not formed in the gate formation region GR, and the nitride semiconductor layers NS3 and NS4 remain intact, to thereby be formed into the cap layer CP2. That is, the part of the nitride semiconductor layers NS3 and NS4 existing in the gate formation region GR does not react with the titanium layer TL and remains intact to thereby be formed into the cap layer CP2. Accordingly, the cap layer CP2 is formed by a stacked layer film (stacked body) of the nitride semiconductor layer NS3 and the nitride semiconductor layer NS4 over the nitride semiconductor layer NS3.

That is, the nitride semiconductor layer NS3 remaining in the gate formation region GR after the thermal treatment of step S7 corresponds to the nitride semiconductor layer CP2a of FIG. 28, and the nitride semiconductor layer NS4 remaining in the gate formation region GR after the thermal treatment of step S7 corresponds to the nitride semiconductor layer CP2b of FIG. 28. Therefore, the cap layer CP2 is formed by a stacked body (stacked layer) of the nitride semiconductor layer CP2a which is the nitride semiconductor layer NS3 remaining in the gate formation region GR after the thermal treatment of step S7, and the nitride semiconductor layer CP2b which is the nitride semiconductor layer NS4 remaining in the gate formation region GR after thermal treatment of step S7.

Since the titanium layer TL is not formed over the nitride semiconductor layer NS4 of the gate formation region GR, there is no significant change in the nitrogen (N) holes of the nitride semiconductor layers NS3 and NS4 in the gate formation region GR before and after the thermal treatment of step S7. Accordingly, by reflecting that the nitride semiconductor layer NS3 before the thermal treatment of step S7 is in an intrinsic state and the nitride semiconductor layer NS4 is in a p-type state, the nitride semiconductor layer CP2a after the thermal treatment of step S7 is in an intrinsic state and the nitride semiconductor layer CP2b is in a p-type state. That is, the cap layer CP2 is supposed to include the nitride semiconductor layer CP2a in an intrinsic state and the p-type nitride semiconductor layer CP2b thereover. When the nitride semiconductor layer NS3 before the thermal treatment of step S7 is an intrinsic gallium nitride layer and the nitride semiconductor layer NS4 is a p-type gallium nitride layer, the cap layer CP2 after the thermal treatment of step S7 is supposed to include the nitride semiconductor layer CP2a including gallium nitride in an intrinsic state and the nitride semiconductor layer CP2b including p-type gallium nitride thereover. The thickness of the cap layer CP2 is approximately equal to the total thickness of the nitride semiconductor layers NS3 and NS4 before the thermal treatment of step S7.

Therefore, the region of the nitride semiconductor layer NS4 having the titanium layer TL formed at an upper part thereof (i.e., a region other than the gate formation region GR) reacts with the titanium layer TL by the thermal treatment of step S7, and upon formation of the titanium nitride layer TNL, under the titanium nitride layer TNL, the nitride semiconductor layer NS5 in an n-type state remains in a layered manner. In addition, since the region of the nitride semiconductor layers NS3 and NS4 having no titanium layer TL formed at an upper part thereof (i.e., the gate formation region GR) does not react with the titanium layer TL by the thermal treatment of step S7, the region remains while maintaining the conductivity intact to thereby be formed into the cap layer CP2.

For example, in a case where a stacked layer film of a titanium layer having a thickness of 40 nm and an aluminum layer having a thickness of 80 nm thereover is formed as the titanium layer TL over p-type GaN layer (nitride semiconductor layer NS4), a titanium nitride layer (titanium nitride layer TNL) having a thickness of 15 nm is formed over the p-type GaN layer (nitride semiconductor layer NS4) having a thickness of 17 nm, by setting the thermal treatment temperature to 850° C. and the thermal treatment time to 60 seconds.

In addition, in a similar manner to the First Embodiment, the tantalum (Ta) layer can also be used in place of titanium (Ti) layer TL also in the present Second Embodiment, in which case a tantalum nitride layer is formed in place of the titanium nitride layer TNL. However, since titanium (Ti) has a higher reactivity than tantalum (Ta), the titanium layer TL is more preferable than the tantalum layer.

Additionally, as with the First Embodiment, the thermal treatment of step S7 can act as activation annealing of the p-type impurities (e.g., Mg) introduced (doped) into the nitride semiconductor layer NS4 also in the present Second Embodiment.

In addition, illustrated in FIG. 32 and FIGS. 33 and 34 described below is a case, where the thickness of the nitride semiconductor layer NS5 is equal to the formation thickness of the nitride semiconductor layer NS3 (therefore the thickness of the nitride semiconductor layer CP2a included in the cap layer CP2), and yet the thickness of the nitride semiconductor layer NS5 need not be equal to the formation thickness of the nitride semiconductor layer NS3 (therefore the thickness of the nitride semiconductor layer CP2a included in the cap layer CP2).

Figure 33:
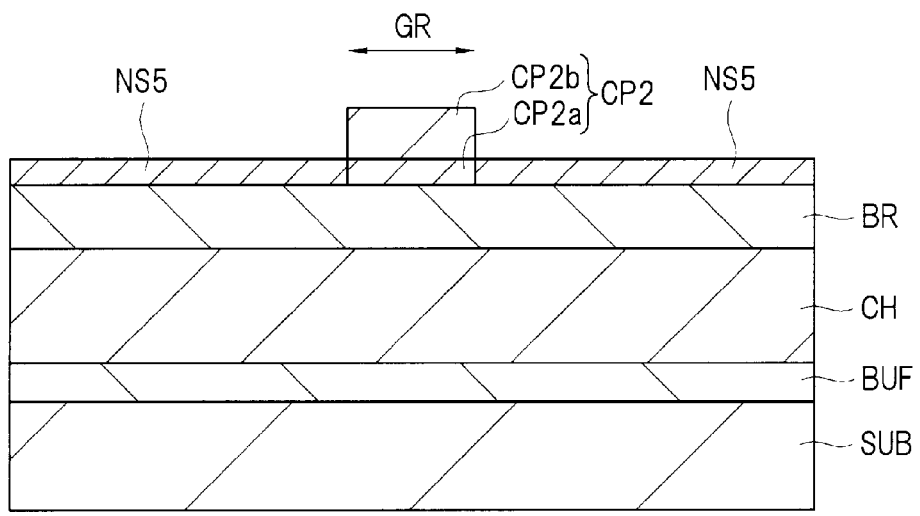
FIG. 33 is a main part cross-sectional view of the semiconductor device during the manufacturing process following FIG. 32.

Next, as illustrated in FIG. 33, the titanium nitride layer TNL is removed by wet etching (step S8 of FIG. 29).

Since the present Second Embodiment is basically similar to the First Embodiment with regard to step S8 (wet etching process), description of similar contents will not be repeated. However, when description with regard to step SB of the First Embodiment is applied to step S8 of the present Second Embodiment, it is supposed that the nitride semiconductor layer NS1 described above corresponds to the stacked layer film of the nitride semiconductor layers NS4 and NS3 or the nitride semiconductor layer NS4 in the present Second Embodiment, and the nitride semiconductor layer NS2 described above corresponds to the nitride semiconductor layer NS5 in the present Second Embodiment.

In the present Second Embodiment, the titanium nitride layer TNL is selectively removed by performing wet etching at step S8 under an etching condition in which the nitride semiconductor layers NS3, NS4, and NS5 are more difficult to etch than the titanium nitride layer TNL, while suppressing etching of the nitride semiconductor layers NS 3, NS4, and NS5.

In the present Second Embodiment, there arises a state in which the nitride semiconductor layer NS5 and the cap layer CP2 remain over the barrier layer BR after the wet etching of step S8. Namely, there arises a state in which the nitride semiconductor layer NS5 is formed over the barrier layer BR, that is, the surface (top surface) of the barrier layer BR is covered with the nitride semiconductor layer NS5, in a region where the titanium layer TL has been formed at steps S6 and S7 (i.e., a region other than the gate formation region GR). In addition, there arises a state in which a stacked layer film of the nitride semiconductor layers NS3 and NS4 (i.e., cap layer CP2) is formed over the barrier layer BR, that is, the surface (top surface) of the barrier layer BR is covered with the stacked layer film of the nitride semiconductor layers NS3 and NS4 (i.e., cap layer CP1), in a region where the titanium layer TL is not formed at steps S6 and S7 (i.e., the gate formation region GR). Therefore, the surface (top surface) of the barrier layer BR is not exposed by performing step S8. Accordingly, the surface (top surface) of the barrier layer BR will not be exposed after the nitride semiconductor layer NS3 has been formed at step S5a. The thickness of the nitride semiconductor layer NS5 remaining over the barrier layer BR after the wet etching of step SB can be about 3 nm (approximately the thickness of the nitride semiconductor layer NS3 formed at step S5a), for example.

Figure 34:
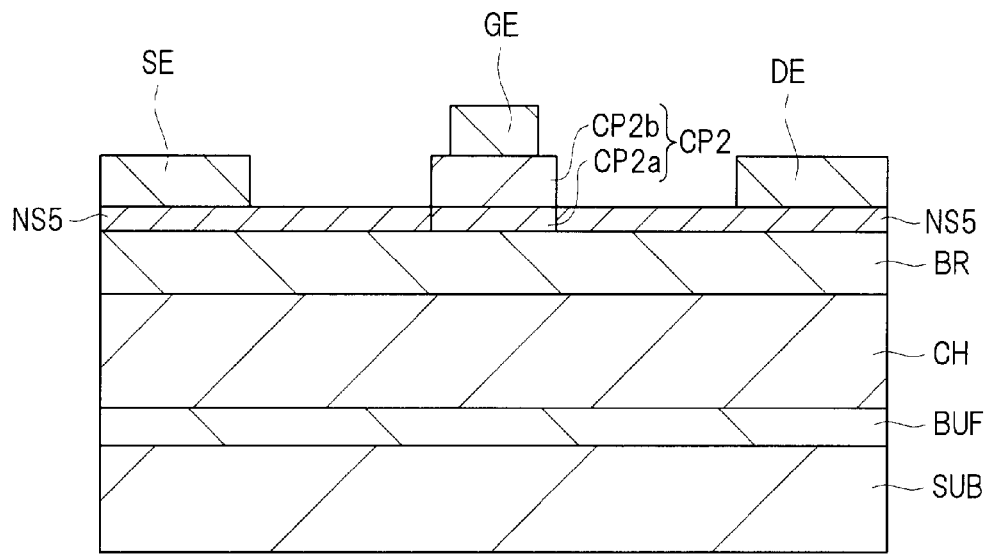
FIG. 34 is a main part cross-sectional view of the semiconductor device during the manufacturing process following FIG. 33.

Next, as illustrated in FIG. 34, the source electrode SE, the drain electrode DE, and the gate electrode GE are formed (step S9 of FIG. 2).

The source electrode SE and the drain electrode DE are formed over the nitride semiconductor layer NS5 over the barrier layer BR. Accordingly, the source electrode SE and the drain electrode DE are brought into a state of being formed over the barrier layer BR via the nitride semiconductor layer NS5. The gate electrode GE is formed over the cap layer CP2 over the barrier layer BR. Accordingly, the gate electrode GE is brought into a state of being formed over the barrier layer BR via the cap layer CP2.

Since the method of forming the source electrode SE, the drain electrode DE, and the gate electrode GE of the present Second Embodiment is similar to that in the First Embodiment, description thereof is omitted here.

In this way, the semiconductor device of the present Second Embodiment is manufactured. In addition, after having formed the source electrode SE, the drain electrode DE, and the gate electrode GE, it may be possible to cover them with a silicon nitride film working as a protection film, or to form a wiring electrode thereon.

Also with the present Second Embodiment, an effect approximately similar to the First Embodiment can be obtained.

Additionally, in the First Embodiment, the nitride semiconductor layer NS2 is formed with increased nitrogen (N) holes therein, with the p-type nitride semiconductor layer NS1 as a base. In contrast, the nitride semiconductor layer NS5 is formed with increased nitrogen (N) holes therein, with the undoped nitride semiconductor layer NS3 as a base in the present Second Embodiment. Accordingly, it is easier in the nitride semiconductor layer NS5 of the present Second Embodiment to increase the effective carrier concentration than in the nitride semiconductor layer NS2 of the First Embodiment. That is, in the present Second Embodiment, the nitride semiconductor layer NS5 is formed into n-type, and the effective carrier concentration is easily increased.

In the present Second Embodiment, since the semiconductor layer (here, the nitride semiconductor layer NS5), with which the source electrode SE and the drain electrode DE are in contact, is of n-type and has a high effective carrier concentration, it becomes easier to ensure ohmic contact between the source electrode SE and the nitride semiconductor layer NS5, and between the drain electrode DE and the nitride semiconductor layer NS5. In addition, the improvement effect (prevention effect) of current collapse can be enhanced by forming the nitride semiconductor layer NS5 into n-type and increasing the effective carrier concentration.

In contrast to this, the First Embodiment, with the cap layer CP1 (CP) being a p-type semiconductor layer as a whole, has an advantage that the normally-off design is easier than the present Second Embodiment with the cap layer CP2 being formed by a stacked body of the intrinsic nitride semiconductor layer CP2a and the p-type nitride semiconductor layer CP2b.

In addition, in the case where the nitride semiconductor layer NS3 formed at step S5 an is a nitride n-type semiconductor layer having n-type impurities doped therein unlike the present Second Embodiment, the nitride semiconductor layer CP2a constituting the lower layer of the cap layer CP2 is also formed into an n-type semiconductor layer. In this case, it is difficult to be formed into a normally-off device (it is easier to be formed into normally-on type). Furthermore, it is also not easy, in terms of deposition, to switch growth of a thin (e.g., about nm) n-type gallium nitride layer having Si (n-type impurities) doped therein to growth of a p-type gallium nitride having Mg (p-type impurities) doped therein.

In contrast to this, since the nitride semiconductor layer NS3 formed at step S5a in the present Second Embodiment is a conductive and undoped nitride semiconductor layer having no impurities doped therein, the nitride semiconductor layer CP2a including the lower layer of the cap layer CP2 is in an intrinsic state. Accordingly, a normally-off device can be realized. In addition, it is easy, in terms of deposition, to switch growth of an undoped thin gallium nitride layer to growth of a p-type gallium nitride having p-type impurities (e.g., Mg) doped therein.

Furthermore, in the semiconductor device, there is concern of generation of current collapse if the thickness of the nitride semiconductor layer NS5 over the barrier layer BR is too small, whereas there is concern of ohmic contact defect if too large. From this viewpoint, in the manufactured semiconductor device, the thickness of the nitride semiconductor layer NS5 over the barrier layer BR is preferably about 1 nm to 5 nm. In addition, setting the formation thickness of the nitride semiconductor layer NS3 equal to or larger than 5 nm, it becomes easy to control the thickness of the nitride semiconductor layer NS5 within a range of 1 to 5 nm.

(Third Embodiment)

In the First and Second Embodiments, application to a normally-off device has been described. In the present Third Embodiment, application to a normally-on device (e.g., a normally-on device for a high frequency amplifier) will be described.

Figure 35:
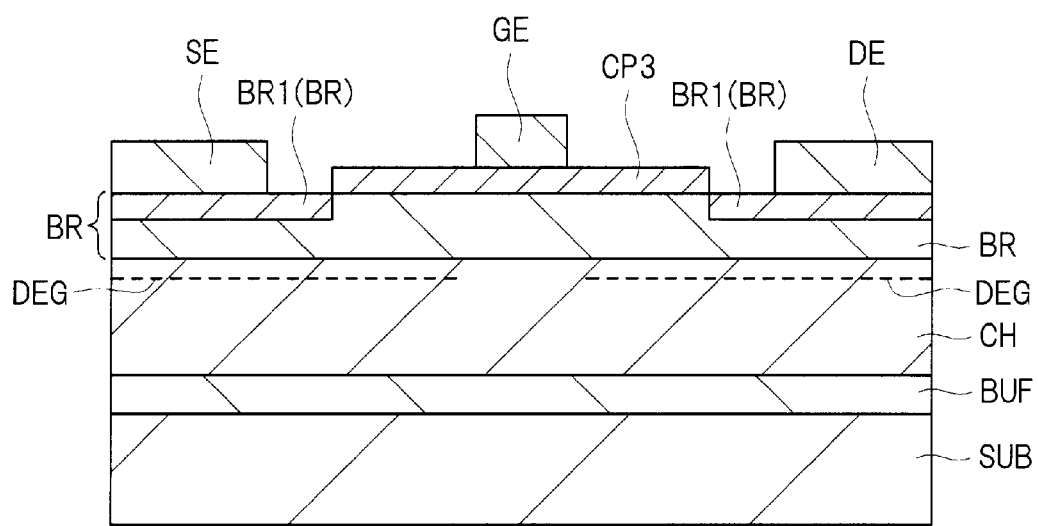
FIG. 35 is a main part cross-sectional view of a semiconductor device of another embodiment.

FIG. 35 is a main part cross-sectional view of a semiconductor device of the present Third Embodiment.

The semiconductor device of the present Third Embodiment illustrated in FIG. 35 is different from the semiconductor device of the First Embodiment illustrated in FIG. 1 described above in that the nitride semiconductor layer NS2 is not formed therein, the cap layer CP3 is formed in place of the cap layer CP (CP1), and a region of a surface part BR1 of the barrier layer BR which is not covered with the cap layer CP3 has a high electron carrier concentration. Since the semiconductor device of the present Third Embodiment is basically the same as the semiconductor device of the First Embodiment with regard to other parts, mainly their differences will be described here.

In the First Embodiment, the cap layer CP (CP 1) has been formed by a p-type nitride semiconductor (p-type gallium nitride). In contrast to this, the cap layer CP3 of the present Third Embodiment is formed by an intrinsic nitride semiconductor (preferably, intrinsic gallium nitride).

The cap layer CP3, including a nitride semiconductor, is preferably formed by gallium nitride (GaN). The cap layer CP3 is formed by an undoped (non-doped) nitride semiconductor, preferably by undoped (non-doped) gallium nitride, and has an intrinsic conductivity. That is, the cap layer CP3 is in a state in which the effective carrier concentration is equal to or less than $1 \times 10^{15}/cm^3$.

Although the gate electrode GE is formed over the barrier layer BR via the cap layer CP3, and the cap layer CP3 is interposed between the barrier layer BR and the gate electrode GE, the cap layer CP3 is intrinsic, and thus the semiconductor device of the present Third Embodiment is a normally-on device.

In addition, the region of the surface layer part BR1 which is not covered with the cap layer CP3 has a higher (larger) electron carrier concentration than other parts of the barrier layer BR (other than the surface layer part BR1). This is because the region of the surface layer part BR1 which is not covered with the cap layer CP3 has nitrogen (N) escaped therefrom and increased nitrogen (N) holes (i.e., increased number of holes per unit volume), in comparison with other parts of the barrier layer BR (other than the surface layer part BR1).

That is, the barrier layer BR including the surface layer part BR1 is in a state of including an undoped (non-doped) nitride semiconductor (preferably, aluminum gallium nitride) having no conductive impurities doped therein, whereas the region of the surface layer part BR1 of the barrier layer BR which is not covered with the cap layer CP3 has n-type carriers (electron carriers) generated therein by nitrogen (N) holes and exhibits an n-type conductivity. In contrast, the barrier layer BR other than the surface layer part BR1, having fewer nitrogen (N) holes than the surface layer part BR1, is in an intrinsic state (i.e., a state in which the effective carrier concentration is equal to or less than $1 \times 10^{15}/cm^3$).

The source electrode SE and the drain electrode DE are formed over the region of the surface layer part BR1 of the barrier layer BR which is not covered with the cap layer CP3. Accordingly, although the source electrode SE and the drain electrode DE are formed in contact with the barrier layer BR over the barrier layer BR, it is the surface layer part BR1 of the barrier layer BR having a raised electron carrier concentration that the source electrode SE and the drain electrode DE are in contact with.

As to other parts, the semiconductor device of the present Third Embodiment is basically the same as the semiconductor device of the First Embodiment.

Figure 36:
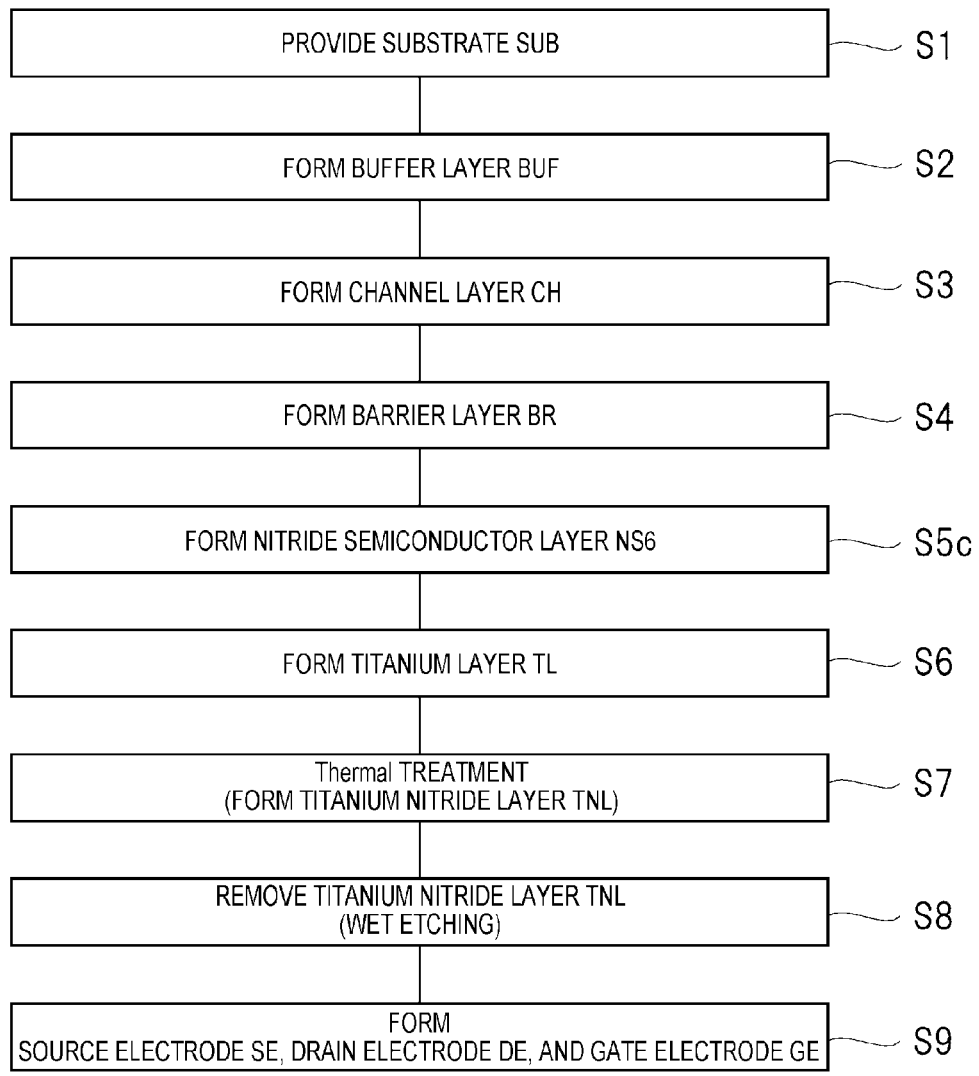
FIG. 36 is a process flow diagram illustrating a manufacturing process of a semiconductor device of another embodiment.

Next, a manufacturing process of the semiconductor device of the present Third Embodiment will be described, referring to FIGS. 36 to 41. FIG. 36 is a process flow diagram illustrating the manufacturing process of the semiconductor device of the present Third Embodiment. FIGS. 37 to 41 are main part cross-sectional views illustrating the manufacturing process of the semiconductor device of the present Third Embodiment, in which a cross-sectional view of a region corresponding to FIG. 36 is illustrated.

The manufacturing process of the present Third Embodiment is similar to the First Embodiment as far as the barrier layer BR is formed at step S4 and the structure of FIG. 5 is obtained, and thus processes after step S4 (barrier layer BR formation process) will be described here.

Figure 37:
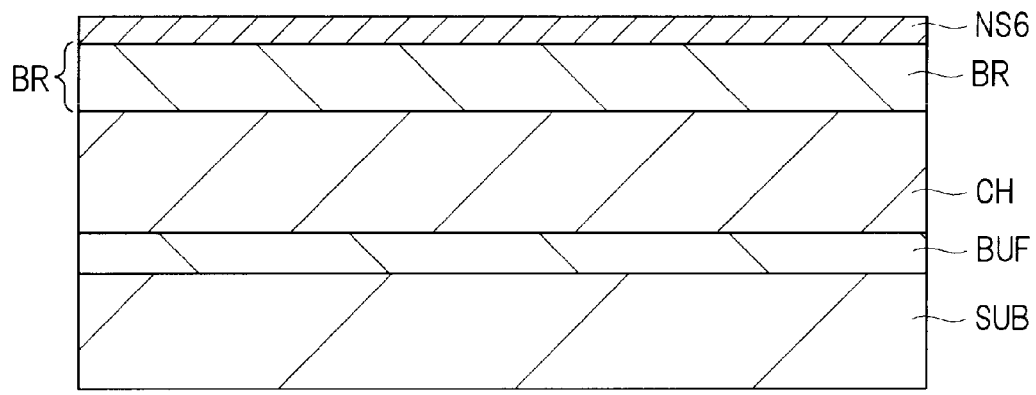
FIG. 37 is a main part cross-sectional view of a semiconductor device during a manufacturing process according to another embodiment.

After having performed steps S1 to S4 in a similar manner to the First Embodiment to obtain the structure of FIG. 5, an undoped (non-doped) nitride semiconductor layer NS6 is formed over the barrier layer BR in the present Third Embodiment, as illustrated in FIG. 37 (step S5c of FIG. 36).

The nitride semiconductor layer NS6, preferably including gallium nitride (GaN), is undoped (non-doped) with no conductive impurities introduced thereinto. The nitride semiconductor layer NS6, which is an epitaxial layer, can be formed using MOCVD, for example. The thickness of the nitride semiconductor layer NS6 can be about 3 nm, for example.

Figure 38:
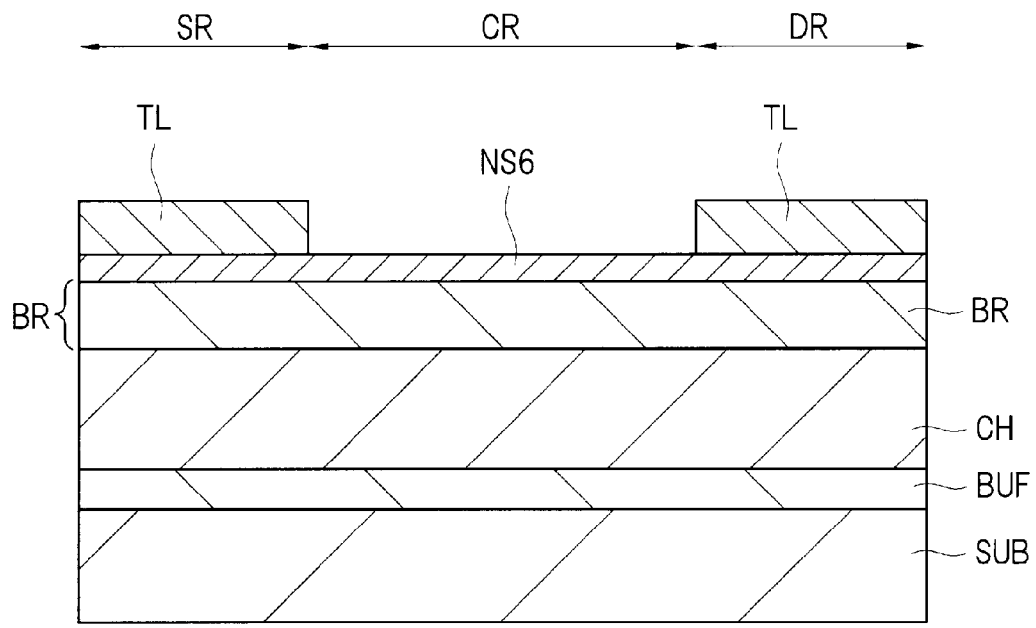
FIG. 38 is a main part cross-sectional view of the semiconductor device during the manufacturing process following FIG. 37.

Next, as illustrated in FIG. 38, the titanium (Ti) layer TL is formed as a metal layer over the nitride semiconductor layer NS6 (step S6 of FIG. 36).

At step S6, although the titanium layer TL has been formed over the nitride semiconductor layer NS1 in the First Embodiment, the titanium layer TL is formed over the nitride semiconductor layer NS6 in the present Third Embodiment. Additionally, in the First Embodiment, there is brought about a state in which the titanium layer TL is not formed in the gate formation region GR of the top surface of the nitride semiconductor layer NS1, whereas the titanium layer TL is formed in a region other than the gate formation region GR. In contrast, the present Third Embodiment brings about a state in which the titanium layer TL is formed in a source electrode formation region SR and a drain electrode formation region DR of the top surface of the nitride semiconductor layer NS6, whereas the titanium layer TL is not formed in other regions.

In the First Embodiment, the titanium layer TL is formed over the nitride semiconductor layer NS1 other than the region where the cap layer CP1 is formed, in order to selectively remove the nitride semiconductor layer NS1 in a region other than the region where the cap layer CP1 is formed.

In contrast, with the present Third Embodiment, in order to selectively remove the nitride semiconductor layer NS6 of a region where securing of ohmic coupling to the barrier layer BR is desired (i.e., a region where the source electrode SE is formed and a region where the drain electrode DE is formed), the titanium layer TL is formed over the nitride semiconductor layer NS6 of a region other than the region where securing of ohmic coupling is desired. Namely, there is brought about a state in which the titanium layer TL is formed in the source electrode formation region SR and the drain electrode formation region DR, whereas the titanium layer TL is not formed in a cap layer formation region CR which is a region other than the source electrode formation region SR and the drain electrode formation region DR. Here, the source electrode formation region SR contains, in a plan view, a region where the source electrode SE is to be formed later, and the drain electrode formation region DR contains, in a plan view, a region where the drain electrode DE is to be formed later. In addition, the cap layer formation region CR corresponds to a region where the cap layer CP3 is to be formed later, containing, in a plan view, a region where the gate electrode GE is to be formed later. Accordingly, the titanium layer TL is formed in the region where the source electrode SE is to be formed later and the region where the drain electrode DE is to be formed later, whereas the titanium layer TL is not formed in the region where the gate electrode GE is to be formed later.

With regard to other parts, step S6 (titanium layer TL formation process) of the present Third Embodiment is basically the same as that of the First Embodiment.

Therefore, similarly to the First Embodiment, the method which has been described referring to FIGS. 8 and 9, for example, can also be applied as means of realizing a state in the present Third Embodiment, in which the titanium layer TL is formed in the source electrode formation region SR and the drain electrode formation region DR of the top surface of the nitride semiconductor layer NS6, whereas the titanium layer TL is not formed in the cap layer formation region CR. Alternatively, the method which has been described referring to FIGS. 10 and 11 can also be applied. In addition, a stacked metal film having the titanium layer TL at the bottom layer can also be formed in place of the single-body film of the titanium layer TL also in the present Third Embodiment, similarly to the First Embodiment.

Figure 39:
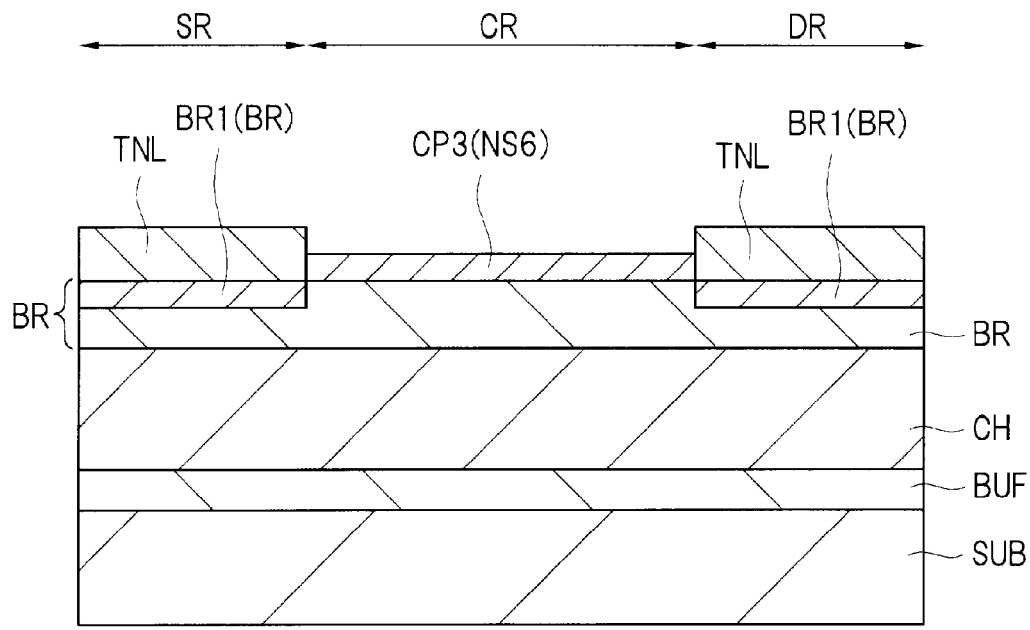
FIG. 39 is a main part cross-sectional view of the semiconductor device during the manufacturing process following FIG. 38.

Next, the titanium layer TL and the nitride semiconductor layer NS6 are caused to react by performing thermal treatment (step S7 of FIG. 36). The thermal treatment (thermal treatment for alloying, alloying process) of step S7 causes the titanium layer TL to react (make an alloy) with the nitride semiconductor layer NS6, and the titanium nitride (TiN) layer TNL, which is a reaction layer (alloying layer) of the titanium layer TL and the nitride semiconductor layer NS6 is formed as illustrated in FIG. 39. The titanium nitride layer TNL can be regarded as a metal nitride layer. In addition, although the titanium nitride layer TNL contains titanium (Ti) and nitrogen (N) as component elements, there may be a case where gallium (Ga) which has been included in the nitride semiconductor layer NS6 is further contained in addition to titanium (Ti) and nitrogen (N). The thermal treatment condition of step S7 can be, for example, a thermal treatment for about 30 seconds to 20 minutes at a temperature of 700 to 900° C. The atmosphere of thermal treatment can be, for example, inert gas atmosphere or nitrogen gas atmosphere.

The difference between the present Third Embodiment and the First Embodiment with regard to step S7 lies in that the titanium layer TL reacts (makes an alloy) with the nitride semiconductor layer NS1 to form the titanium nitride layer TNL in the First Embodiment, whereas, in the present Third Embodiment, the titanium layer TL reacts (makes an alloy) with the nitride semiconductor layer NS6 to form the titanium nitride layer TNL.

In addition, the First Embodiment has caused the nitride semiconductor layer NS2 to remain under the titanium nitride layer TNL in a layered manner after the thermal treatment of step S7. In contrast, it is preferable in the present Third Embodiment to cause the nitride semiconductor layer NS5 to remain under the titanium nitride layer TNL in a layered manner after the thermal treatment of step S7. Namely, it is preferable that the formation thickness of the nitride semiconductor layer NS6 at step S5c, the formation thickness of the titanium layer IL at step S6, and the thermal treatment condition at step S7 or the like are adjusted so that the entire thickness of the nitride semiconductor layer NS6 reacts (makes an alloy) with the titanium layer TL by the thermal treatment of step S7 in the region where the titanium layer TL has been formed.

Accordingly, there arises a state after the thermal treatment of step S7 in which no unreacted layer of the nitride semiconductor layer NS6 remains under the titanium nitride layer TNL, whereas nitrogen (N) has been absorbed for generating the titanium nitride layer TNL in the surface layer part BR1 of the barrier layer BR immediately under the titanium nitride layer TNL, and nitrogen (N) holes have increased thereby. Namely, the barrier layer BR after the thermal treatment of step S7 is in a state in which, in comparison with the barrier layer BR before the thermal treatment of step S7, only the part located immediately under the titanium nitride layer TNL of the surface layer part BR1 has nitrogen (N) escaped therefrom with increased nitrogen (N) holes therein. Therefore, the barrier layer BR after the thermal treatment of step S7 is in a state in which the surface layer part BR1 of the part located immediately under the titanium nitride layer TNL has increased nitrogen (N) holes (number of holes per unit volume) therein, in comparison with the barrier layer BR other than the part (other than the surface layer part BR1).

When the barrier layer BR is formed by an undoped nitride semiconductor (preferably, undoped aluminum gallium nitride) at step S4, the entire barrier layer BR including the surface layer part BR1 is formed by an undoped nitride semiconductor (preferably, undoped aluminum gallium nitride) also after the thermal treatment of step S7. Accordingly, the barrier layer BR before the thermal treatment of step S7 has an intrinsic conductivity as a whole. However, with regard to the barrier layer BR after the thermal treatment of step S7, the part located immediately under the titanium nitride layer TNL of the surface layer part BR1 of the barrier layer BR has an n-type conductivity due to occurrence of n-type carriers (electron carriers) caused by nitrogen (N) holes. In contrast, the barrier layer BR other than the surface layer part BR1 remains in an intrinsic state after the thermal treatment of step S7.

In addition, since the titanium layer TL is not formed in the cap layer formation region CR when performing the thermal treatment of step S7, the titanium nitride layer TNL is not formed in the cap layer formation region CR region, and the nitride semiconductor layer NS6 remains intact to thereby be formed into the cap layer CP3. Namely, the nitride semiconductor layer NS6 in the source electrode formation region SR and the drain electrode formation region DR of the nitride semiconductor layer NS6 reacts with the titanium layer TL, whereas the nitride semiconductor layer NS6 in the cap layer formation region CR remains intact without reacting with the titanium layer TL to thereby be formed into the cap layer CP3. Accordingly, the cap layer CP3 is formed by the nitride semiconductor layer NS6.

Since the titanium layer TL is not formed over the nitride semiconductor layer NS6 of the cap layer formation region CR, there is no significant change in the nitrogen (N) holes before and after the thermal treatment of step S7 with regard to the nitride semiconductor layer NS6 in the cap layer formation region CR and the barrier layer BR in the cap layer formation region CR. Accordingly, reflecting that the nitride semiconductor layer NS6 before the thermal treatment of step S7 is in an intrinsic state, the cap layer CP3 after the thermal treatment of step S7 is in an intrinsic state. In the case where the nitride semiconductor layer NS6 before the thermal treatment of step S7 is an undoped and intrinsic gallium nitride layer, the cap layer CP3 after the thermal treatment of step S7 also includes gallium nitride which is undoped and in an intrinsic state. The thickness of the cap layer CP3 is approximately equal to the thickness of the nitride semiconductor layer NS6 before the thermal treatment of step S7. In addition, reflecting that the barrier layer BR before the thermal treatment of step S7 is undoped and in an intrinsic state, the barrier layer BR immediately under the cap layer CP3 is also undoped and in an intrinsic state.

Here, the part of the surface layer part BR1 of the barrier layer BR located immediately under the titanium nitride layer TNL coincides with the region of the surface layer part BR1 of the barrier layer BR which is not covered with the cap layer CP3. This is because the cap layer CP is formed in the region where the titanium nitride layer TNL is not formed, and thus the region located immediately under the titanium nitride layer TNL and the region which is not covered with the cap layer CP3 substantially indicates the same region in the barrier layer BR.

Therefore, in the region of the surface layer part BR1 of the barrier layer BR which is not covered with the cap layer CP3, there are more nitrogen (N) holes (a larger number of holes per unit volume) than the barrier layer BR other than the part (other than the surface layer part BR1), whereby the density of an electron carrier becomes high. Namely, with regard to the barrier layer BR, the region of the surface layer part BR1 of the barrier layer BR which is not covered with the cap layer CP3 has more nitrogen (N) holes (a larger number of holes per unit volume) than the region which is deeper than the surface layer part BR1 or the region covered with the cap layer CP3, whereby the electron carrier concentration is increased.

For example, an intrinsic GaN layer (nitride semiconductor layer NS6) having a thickness of 18 nm is formed over an AlGaN layer (barrier layer BR) having a thickness of 3 nm and an Al composition of 0.2, and a stacked layer film of a titanium layer having a thickness of 40 nm and an aluminum layer having a thickness of 80 nm thereover are formed as the titanium layer TL over the GaN layer, and a thermal treatment is performed with a thermal treatment time of 60 seconds at a thermal treatment temperature of 770° C. Accordingly, a titanium nitride layer having a thickness of 5 nm (titanium nitride layer TNL) is formed.

In addition, similarly to the First Embodiment, a tantalum (Ta) layer can also be used in place of the titanium (Ti) layer TL in the present Third Embodiment, in which case a tantalum nitride layer is formed in place of the titanium nitride layer TNL. However, since titanium (Ti) has a higher reactivity than tantalum (Ta), the titanium layer TL is more preferable than the tantalum layer.

Figure 40:
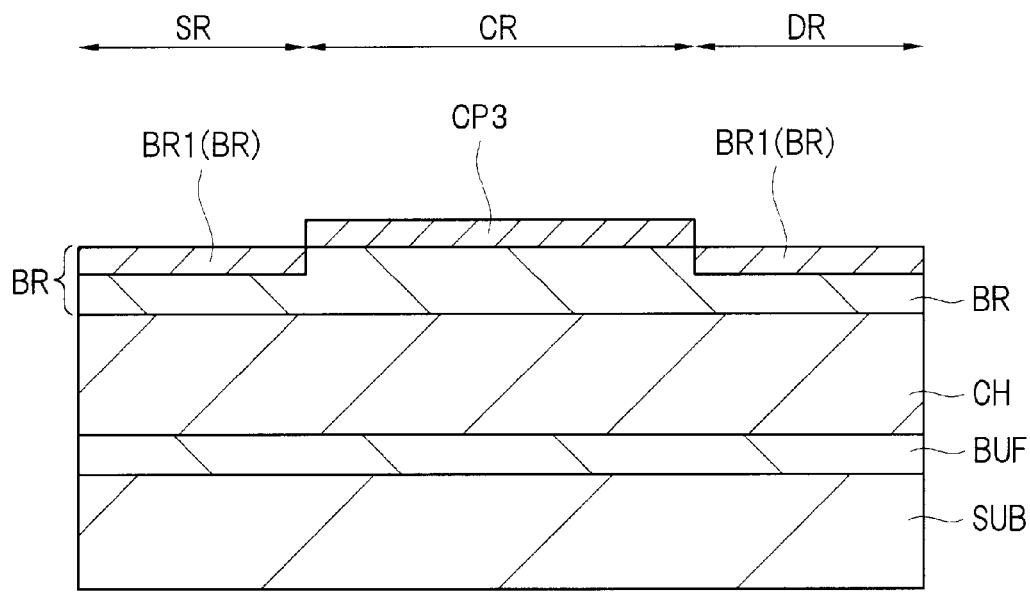
FIG. 40 is a main part cross-sectional view of the semiconductor device during the manufacturing process following FIG. 39.

Next, as illustrated in FIG. 40, the titanium nitride layer TNL is removed by wet etching (step S8 of FIG. 36). Although hydrofluoric acid (HF) can be preferably used as the etchant, aqua regia or the like, for example, can also be used other than hydrofluoric acid.

It is preferable that step S8 performs etching under a condition (etching condition) that the etching speed of the nitride semiconductor layer NS6 (cap layer CP3) and the barrier layer BR is higher (faster) than the etching speed of the titanium nitride layer TNL. Namely, it is preferable that etching is performed at step S8 under a condition (etching condition) that the etching speed of the nitride semiconductor layer NS6 (cap layer CP3) and the barrier layer BR is lower (slower) than the etching speed of the titanium nitride layer TNL. That is, it is preferable that etching is performed at step SB under an etching condition that the nitride semiconductor layer NS6 (cap layer CP3) and the barrier layer BR are more difficult to etch than the titanium nitride layer TNL. Accordingly, the titanium nitride layer TNL can be selectively removed at step S8 while suppressing etching of the nitride semiconductor layer NS6 (cap layer CP3) and the barrier layer BR.

Although almost no gallium nitride (GaN) can be etched using hydrofluoric acid or aqua regia, the titanium nitride layer TNL resulting from reaction with the titanium layer TL can be etched by hydrofluoric acid or aqua regia. Taking advantage of this, the titanium nitride layer TNL can be selectively removed, while suppressing etching of the gallium nitride layer.

In addition, after the titanium nitride layer TNL is removed at step S8, if an unreacted titanium layer TL has remained over the titanium nitride layer TNL in the thermal treatment of step S7, the unreacted titanium layer TL can be removed at step SB. Additionally, in a case using stacked layer film (stacked metal film having the titanium layer TL at the bottom layer) including the titanium layer TL in place of a single-body film of the titanium layer TL, the metal layer remaining over the titanium nitride layer TNL is also removed at step S8.

After the wet etching of step S8, there arises a state in which the cap layer CP3 remains over the barrier layer BR. Namely, the region where the titanium layer TL has been formed at steps S6 and S7 (i.e., the source electrode formation region SR and the drain electrode formation region DR) is in a state in which the cap layer CP3 is not formed over the barrier layer BR and the surface of the barrier layer BR is exposed thereby, whereas the surface layer part BR1 of the barrier layer BR has increased nitrogen (N) holes and increased electron carrier concentration thereby. In contrast, the region where the titanium layer TL is not formed at steps S6 and S7 (i.e., cap layer formation region CR) is in a state in which the nitride semiconductor layer NS6 (cap layer CP3) is formed over the barrier layer BR, that is, the surface (top surface) of the barrier layer BR is covered with the nitride semiconductor layer NS6 (cap layer CP3).

In addition, there may also be a case where the region of the barrier layer PR which is not covered with the cap layer CP3 is somewhat etched (over-etched) by the wet etching of step S8. It is also preferable in this case to avoid the entire surface layer part BR1, with increased nitrogen (N) holes and a higher electron carrier concentration, being removed by over-etching so that the surface layer part BR1 remains in a layered manner. Accordingly, the region (surface layer part) of the barrier layer BR, with which the subsequently formed source electrode SE and the drain electrode DE are in contact can be regarded as having increased nitrogen (N) holes and increased electron carrier concentration. That is, it is preferable to cause the surface layer part BR1, having an increased electron carrier concentration due to escaped nitrogen (N) therefrom and increased nitrogen (N) holes therein, to remain after the wet etching of step S8 in a layered manner, and cause the source electrode SE and the drain electrode DE to be formed later to contact the surface layer part BR1 having an increased electron carrier concentration.

For example, an intrinsic GaN layer (nitride semiconductor layer NS6) having a thickness of 3 nm is formed over an AlGaN layer (barrier layer BR) having a thickness of 18 nm, a stacked layer film of the titanium layer and an aluminum layer thereover is formed as the titanium layer TL, and a titanium nitride layer having a thickness of 5 nm (titanium nitride layer TNL) is formed by thermal treatment, and the layers are dipped into hydrofluoric acid (HF) as wet etching for about 20 minutes. Accordingly, etching is performed from the surface of the GaN layer (nitride semiconductor layer NS6) up to a depth of about 7 nm, in which case the AlGaN layer (barrier layer BR) is assumed to have been etched to an extent of about 4 nm (over-etching).

Figure 41:
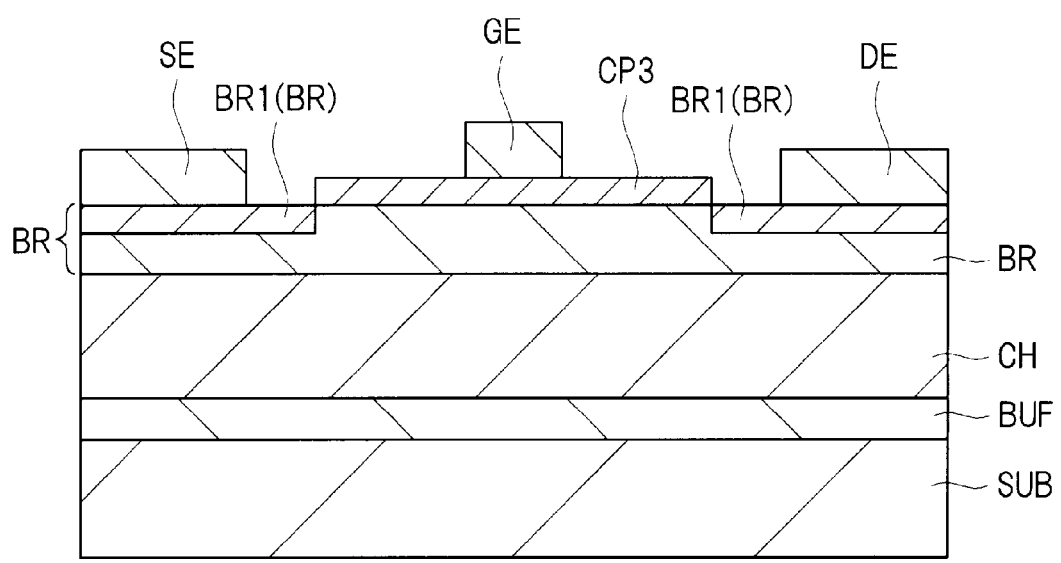
FIG. 41 is a main part cross-sectional view of the semiconductor device during the manufacturing process following FIG. 40.

Next, as illustrated in FIG. 41, the source electrode SE, the drain electrode DE, and the gate electrode GE are formed (step S9 of FIG. 36).

The source electrode SE and the drain electrode DE are formed over a region of the barrier layer BR which is not covered with the cap layer CP3. Namely, the source electrode SE is formed over the barrier layer BR in the source electrode formation region SR, and the drain electrode DE is formed over the barrier layer BR in the drain electrode formation region DR. Accordingly, the source electrode SE and the drain electrode DE are supposed to be formed over the surface layer part BR1 of the barrier layer BR, in contact with the surface layer part BR1. The gate electrode GE is formed over the cap layer CP3 over the barrier layer BR. Accordingly, the gate electrode GE is in a state of being formed over the barrier layer BR via the cap layer CP3.

Since the formation method of the source electrode SE, the drain electrode DE, and the gate electrode GE of the present Third Embodiment can be performed in a manner similar to the First Embodiment, description thereof will be omitted here.

In this way, the semiconductor device of the present Third Embodiment is manufactured. In addition, after having formed the source electrode SE, the drain electrode DE, and the gate electrode GE, they may be covered with a silicon nitride film working as a protection film, or a wiring electrode may be formed thereover.

In the present Third Embodiment, since the cap layer CP3 is formed over the barrier layer BR, the part of the barrier layer BR which is covered with the cap layer CP3 can be prevented from being exposed. Accordingly, the part of the barrier layer BR which is covered with the cap layer CP3 can be prevented from being oxidized. Accordingly, current collapse caused by oxidization of the surface of the barrier layer BR can be suppressed. Therefore, the performance of the semiconductor device can be enhanced. In addition, the reliability of the semiconductor device can be enhanced.

In addition, since the cap layer CP3 is in an intrinsic state, a normally-on device can be realized.

In addition, unlike the present Third Embodiment, when the intrinsic nitride semiconductor layer NS6 is interposed between the source electrode SE and the barrier layer BR, and between the drain electrode DE and the barrier layer BR, it becomes difficult to secure a good ohmic contact of the source electrode SE and a good ohmic contact of the drain electrode DE. Therefore, it is necessary to remove the intrinsic nitride semiconductor layer NS6 from the source electrode formation region SR and the drain electrode formation region DR. However, using dry etching, unlike the present Third Embodiment, to remove the nitride semiconductor layer NS6 of the source electrode formation region SR and the drain electrode formation region DR causes an etching damage in the exposed surface (exposed surface of the barrier layer BR) after etching, thereby making it difficult to obtain a low ohmic contact resistance between the source electrode SE or the drain electrode DE and the barrier layer BR. In addition, dry etching also makes it difficult to control the etching depth.

In contrast, the present Third Embodiment allows, by forming the titanium layer TL over the nitride semiconductor layer NS6 at step 6, performing thermal treatment at step S7 to cause a reaction between the titanium layer TL and the nitride semiconductor layer NS6, and removing the generated reaction layer (titanium nitride layer TNL) by the wet etching of step S8, the reaction layer (titanium nitride layer TNL) to be selectively removed. Accordingly, defects of using dry etching can be overcome, as well as selectively removing unnecessary parts of the nitride semiconductor layer NS6 by wet etching. Accordingly, etching damage in the exposed surface of the barrier layer BR after etching can be suppressed or prevented, whereby a good ohmic contact can be secured between the source electrode SE and the barrier layer BR, and between the drain electrode DR and the barrier layer BR so that a low ohmic contact resistance can be realized. In addition, control of etching depth is facilitated. Therefore, the performance of the semiconductor device can be enhanced. In addition, the reliability of the semiconductor device can be enhanced.

Furthermore, in the source electrode formation region SR and the drain electrode formation region DR of the present Third Embodiment, the surface layer part BR1 of the barrier layer BR is brought into an n-type state by increasing the nitrogen (N) holes therein caused by escape of nitrogen (N) therefrom to increase the electron carrier concentration. The source electrode SE and the drain electrode DE are then formed over the surface layer part BR1 which has become of n-type by the increased electron carrier concentration. Accordingly, the barrier layer BR of the part at which the source electrode SE and the drain electrode DE come in contact is in an n-type state. Accordingly, a still better ohmic contact is secured between the source electrode SE and the surface layer part BR1 of the barrier layer BR, and between the drain electrode DE and the surface layer part BR1 of the barrier layer BR, as well as securing a still lower ohmic contact resistance can be realized between the source electrode SE and the surface layer part BR1 of the barrier layer BR, and between the drain electrode DE and the surface layer part BR1 of the barrier layer BR. Therefore, the performance of the semiconductor device can be enhanced. In addition, the reliability of the semiconductor device can be enhanced.

Although, in the First, Second, and Third Embodiments, gallium nitride (GaN) is preferable as materials included in the nitride semiconductor layers NS1 and NS2, NS3, NS4, NS5, and NS6, aluminum gallium nitride (AlGaN) can also be used other than that. However, gallium nitride (GaN) is more preferable. Forming the nitride semiconductor layers NS1 and NS2, NS3, NS4, NS5, and NS6 by gallium nitride (GaN) prevents generation of the exposed part of aluminum gallium nitride (AlGaN) after formation of the nitride semiconductor layer NS1 (or, the nitride semiconductor layer NS3 or the nitride semiconductor layer NS6), whereby the prevention of oxidation of aluminum gallium nitride (AlGaN) is allowed, making it possible to prevent current collapse more appropriately.

Hereinbefore, although the invention made by the present inventor has been specifically explained on the basis of the embodiments, it is needless to say that the invention is not limited to the above-mentioned embodiments and can be modified variously within the scope not departing from the gist thereof.

A part of the contents described in the above embodiments are described below.

[Appendix 1]

A semiconductor device having a field effect transistor, including:

a substrate;

a channel layer being formed over the substrate and including a nitride semiconductor;

a first nitride semiconductor layer being formed over the channel layer and having a larger band gap than the channel layer;

a cap layer in an intrinsic state formed over the first nitride semiconductor layer;

a gate electrode formed over the cap layer; and a source electrode and a drain electrode formed in a region over the first nitride semiconductor layer where the cap layer is not formed, in which a surface layer part of the first nitride semiconductor layer in the region which is not covered with the cap layer has a higher electron carrier concentration than the first nitride semiconductor layer in a region other than the surface layer part.

[Appendix 2]

The semiconductor device according to appendix 1, in which the first nitride semiconductor layer is an aluminum gallium nitride layer.

[Appendix 3]

The semiconductor device according to appendix 1, in which the surface layer part is of n-type, and the first nitride semiconductor layer in the region other than the surface layer part is in an intrinsic state.

[Appendix 4]

The semiconductor device according to appendix 3, in which the cap layer includes gallium nitride.

What is claimed is:

1. A semiconductor device having a field effect transistor, comprising:

a substrate;

a channel layer being formed over the substrate and including a nitride semiconductor;

a first nitride semiconductor layer, being an electron supply layer, and being formed over the channel layer and having a larger band gap than the channel layer;

a cap layer formed over the first nitride semiconductor;

a gate electrode formed over the cap layer;

a second nitride semiconductor layer formed in a region which is different from the cap layer, over the first nitride semiconductor layer; and a source electrode and a drain electrode, formed over the second nitride semiconductor layer, wherein the cap layer is a p-type semiconductor layer, and the second nitride semiconductor layer includes the same type of material as the cap layer, and is in an intrinsic state or an n-type state, wherein the cap layer includes gallium nitride, and the second nitride semiconductor layer includes gallium nitride, wherein the gallium nitride of the second nitride semiconductor layer is nitrogen poor.

2. The semiconductor device according to claim 1, wherein the first nitride semiconductor layer is an aluminum gallium nitride layer.

* * * * *